United States Patent
Jang et al.

(10) Patent No.: US 11,910,611 B2
(45) Date of Patent: Feb. 20, 2024

(54) NONVOLATILE MEMORY DEVICE AND METHOD FOR FABRICATING THE SAME

(71) Applicant: Samsung Electronics Co., Ltd., Suwon-si (KR)

(72) Inventors: Dong Hoon Jang, Seoul (KR); Woo Sung Yang, Gwangmyeong-si (KR); Joon Sung Lim, Seongnam-si (KR); Sung Min Hwang, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/507,989

(22) Filed: Oct. 22, 2021

(65) Prior Publication Data

US 2022/0045081 A1 Feb. 10, 2022

Related U.S. Application Data

(63) Continuation of application No. 16/512,513, filed on Jul. 16, 2019, now abandoned.

(30) Foreign Application Priority Data

Dec. 4, 2018 (KR) .................. 10-2018-0154259

(51) Int. Cl.
*H10B 43/40* (2023.01)
*H01L 23/522* (2006.01)
(Continued)

(52) U.S. Cl.
CPC ......... *H10B 43/40* (2023.02); *H01L 23/5226* (2013.01); *H10B 43/10* (2023.02); *H10B 43/27* (2023.02)

(58) Field of Classification Search
None
See application file for complete search history.

(56) References Cited

U.S. PATENT DOCUMENTS

| 7,592,625 B2 | 9/2009 | Park et al. |
| 7,638,430 B2 | 12/2009 | Kim |

(Continued)

FOREIGN PATENT DOCUMENTS

| KR | 20000004453 A | 1/2000 |
| KR | 20070007608 A | 1/2007 |

(Continued)

OTHER PUBLICATIONS

Non-Final Office Action dated Jan. 4, 2021 issued in U.S. Appl. No. 16/512,513.

(Continued)

*Primary Examiner* — Michelle Mandala
*Assistant Examiner* — Jordan M Klein
(74) *Attorney, Agent, or Firm* — Harness, Dickey & Pierce, P.L.C.

(57) ABSTRACT

A nonvolatile memory device includes a substrate including a cell region and a peripheral circuit region, a stacked structure on the cell region, the stacked structure including a plurality of gate patterns separated from each other and stacked sequentially, a semiconductor pattern connected to the substrate through the stacked structure, a peripheral circuit element on the peripheral circuit region, a first interlayer insulating film on the cell region and the peripheral circuit region, the first interlayer insulating film covering the peripheral circuit element, and a lower contact connected to the peripheral circuit element through the first interlayer insulating film, a height of a top surface of the lower contact being lower than or equal to a height of a bottom surface of a lowermost gate pattern of the plurality of gate patterns on the first interlayer insulating film.

8 Claims, 38 Drawing Sheets

(51) Int. Cl.
*H10B 43/27* (2023.01)
*H10B 43/10* (2023.01)

(56) References Cited

U.S. PATENT DOCUMENTS

| | | | |
|---|---|---|---|
| 7,919,369 B2 | 4/2011 | Kim | |
| 8,247,304 B2 | 8/2012 | Youn | |
| 9,735,014 B2 | 8/2017 | Jung et al. | |
| 2012/0061744 A1 | 3/2012 | Hwang et al. | |
| 2014/0021632 A1* | 1/2014 | Lee | H01L 21/76816 |
| | | | 257/774 |
| 2014/0199815 A1* | 7/2014 | Hwang | H10B 43/35 |
| | | | 438/270 |
| 2017/0103993 A1 | 4/2017 | Lee et al. | |

FOREIGN PATENT DOCUMENTS

| | | |
|---|---|---|
| KR | 10-20120026881 A | 3/2012 |
| KR | 101195268 B1 | 11/2012 |
| KR | 10-20180027708 A | 3/2018 |

OTHER PUBLICATIONS

Final Office Action dated Jul. 22, 2021 issued in U.S. Appl. No. 16/512,513.
Korean Office Action, dated Oct. 17, 2023, issued in Korean Patent Application No. KR 10-2018-0154259.

* cited by examiner

NONVOLATILE MEMORY DEVICE AND METHOD FOR FABRICATING THE SAME

CROSS-REFERENCE TO RELATED APPLICATION

This application is a Continuation of U.S. application Ser. No. 16/512,513, filed on Jul. 16, 2019, which claims priority from Korean Patent Application No. 10-2018-0154259 filed on Dec. 4, 2018 in the Korean Intellectual Property Office, and all the benefits accruing therefrom under 35 U.S.C. 119, the contents of which in its entirety are herein incorporated by reference.

BACKGROUND

1. Technical Field

The present disclosure relates to a nonvolatile memory device and a method for fabricating the same and, more particularly, to a nonvolatile memory device including a peripheral circuit contact and a method for fabricating the same.

2. Description of the Related Art

Semiconductor memory devices are memory devices embodied using semiconductors such as silicon (Si), germanium (Ge), gallium arsenide (GaAs) and indium phosphide (InP). Semiconductor memory devices may be generally classified into volatile memory devices and nonvolatile memory devices.

The volatile memory device is a memory device in which data stored therein is lost when power is interrupted. Representative examples of the volatile memory device may include a static random access memory (SRAM), a dynamic RAM (DRAM), a synchronous DRAM (SDRAM), and the like. The nonvolatile memory device is a memory device which retains data stored therein even when power is cut off. Representative examples of the nonvolatile memory device may include a read only memory (ROM), a programmable ROM (PROM), an electrically programmable ROM (EPROM), an electrically erasable programmable ROM (EEPROM), a resistive memory device (e.g., a phase-change RAM (PRAM), a ferroelectric RAM (FRAM), a resistive RAM (RRAM)), and the like.

Meanwhile, the degree of integration of nonvolatile memory devices has been increasing in order to satisfy the excellent performance and low price required by consumers. However, in the case of a two-dimensional or flat memory device, the degree of integration is determined by the area occupied by unit memory cells. Therefore, recently, a three-dimensional memory device in which unit memory cells are arranged vertically has been developed.

SUMMARY

Some example embodiments provide a nonvolatile memory device with improved integration degree, reliability and performance by forming a lower contact in a peripheral circuit region.

Some example embodiments also provide a method for fabricating a nonvolatile memory device with improved integration degree, reliability and performance by forming a lower contact in a peripheral circuit region.

However, some other example embodiments are not restricted to those set forth herein. The above and other aspects of the present invention will become more apparent to one of ordinary skill in the art to which the present invention pertains by referencing the detailed description of the present invention given below.

According to some example embodiments of the present inventive concepts, there is provided a nonvolatile memory device comprising a substrate including a cell region and a peripheral circuit region, a stacked structure on the cell region, the stacked structure including a plurality of gate patterns separated from each other and stacked sequentially, a semiconductor pattern connected to the substrate through the stacked structure, a peripheral circuit element on the peripheral circuit region, a first interlayer insulating film on the cell region and the peripheral circuit region, the first interlayer insulating film covering the peripheral circuit element, and a lower contact connected to the peripheral circuit element through the first interlayer insulating film, a height of a top surface of the lower contact being lower than or equal to a height of a bottom surface of a lowermost gate pattern of the plurality of gate patterns on the first interlayer insulating film.

According to some example embodiments of the present inventive concepts, there is provided a nonvolatile memory device comprising a substrate including a cell region and a peripheral circuit region, a ground selection line on the cell region, the ground selection line extending along a top surface of the substrate, a peripheral circuit element on the peripheral circuit region, a first interlayer insulating film on the substrate, the first interlayer insulating film covering the ground selection line and the peripheral circuit element, a mold structure on the first interlayer insulating film of the cell region, the mold structure including a word line and an insulation pattern stacked alternately, a second interlayer insulating film on the first interlayer insulating film, the second interlayer insulating film covering the mold structure and the peripheral circuit region, a semiconductor pattern connected to the substrate through the ground selection line, the first interlayer insulating film, and the mold structure, and a peripheral circuit contact including a lower contact and an upper contact, the lower contact being connected to the peripheral circuit element through the first interlayer insulating film, and the upper contact being connected to the lower contact through the second interlayer insulating film.

According to some example embodiments of the present inventive concepts, there is provided a nonvolatile memory device comprising a substrate including a cell region and a peripheral circuit region, a stacked structure on the cell region, the stacked structure including a first gate pattern, a second gate pattern, and a third gate pattern separated from each other and stacked sequentially from a top surface of the substrate, a semiconductor pattern connected to the substrate through the stacked structure, a peripheral circuit element on the peripheral circuit region, a first interlayer insulating film on the substrate, the first interlayer insulating film covering the first gate pattern and the peripheral circuit element, and a lower contact connected to the peripheral circuit element through the first interlayer insulating film, a separation distance between the first gate pattern and the second gate pattern being greater than a separation distance between the second gate pattern and the third gate pattern, and a height of a top surface of the lower contact being lower than or equal to a height of a bottom surface of the third gate pattern.

According to some example embodiments of the present inventive concepts, there is provided a method for fabricating a nonvolatile memory device, the method comprising providing a substrate including a cell region and a peripheral circuit region, forming a peripheral circuit element on the peripheral circuit region, forming a first interlayer insulating film on the cell region and the peripheral circuit region, the first interlayer insulating film covering the peripheral circuit element, forming a lower contact on the peripheral circuit region, the lower contact being connected to the peripheral circuit element through the first interlayer insulating film, forming a mold structure on the first interlayer insulating film of the cell region, the mold structure including a plurality of gate patterns separated from each other and stacked sequentially, and forming a semiconductor pattern connected to the substrate through the mold structure.

According to some example embodiments of the present inventive concepts, there is provided a method for fabricating a nonvolatile memory device, the method comprising providing a substrate including a cell region and a peripheral circuit region, forming a peripheral circuit element on the peripheral circuit region, forming a first sacrificial pattern on the substrate of the cell region and the peripheral circuit element, forming a first interlayer insulating film on the first sacrificial pattern, forming a lower contact connected to the peripheral circuit element through the first interlayer insulating film of the peripheral circuit region, forming a mold structure on the first interlayer insulating film of the cell region, the mold structure including a plurality of second sacrificial patterns separated from each other and stacked sequentially, forming a second interlayer insulating film on the first interlayer insulating film, the second interlayer insulating film covering the mold structure and the peripheral circuit region, forming a plurality of gate patterns separated from each other and stacked sequentially, in place of the first sacrificial pattern and the plurality of second sacrificial patterns, and forming an upper contact connected to the lower contact through the second interlayer insulating film.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION

Hereinafter, a nonvolatile memory device according to some example embodiments of the present inventive concepts will be described with reference to FIGS. 1 to 13.

Figure 1:
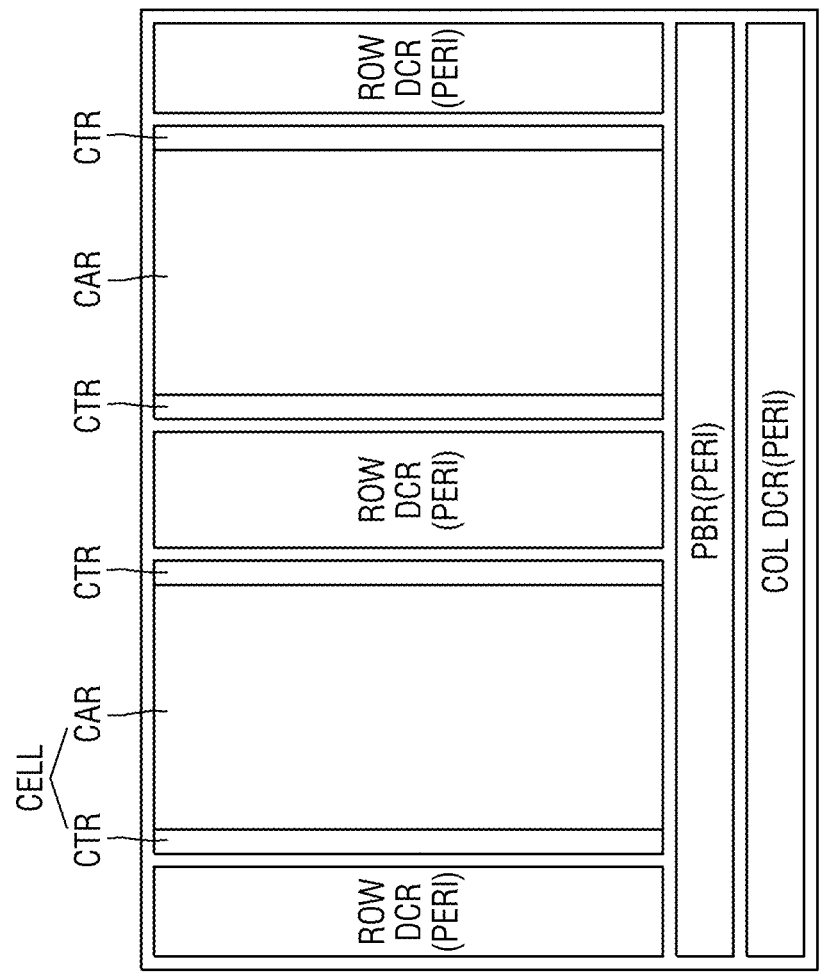
FIG. 1 is a schematic plan view illustrating a nonvolatile memory device according to some example embodiments of the present inventive concepts.
Figure 2:
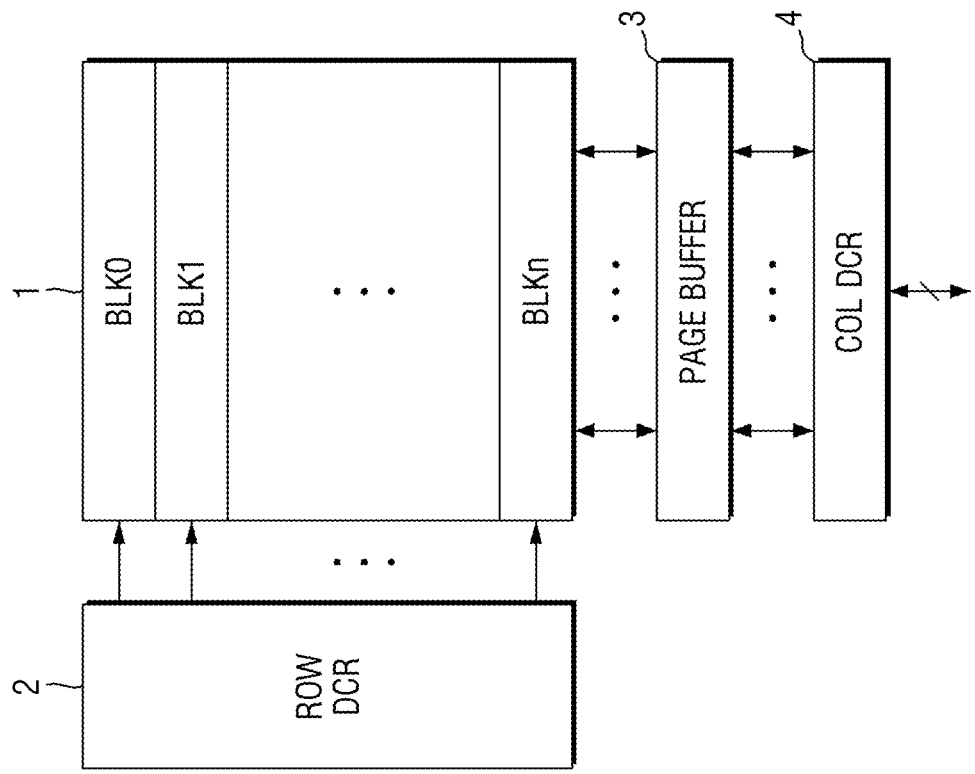
FIG. 2 is a block diagram explaining the nonvolatile memory device of FIG. 1.

FIG. 1 is a schematic plan view illustrating a nonvolatile memory device according to some example embodiments of the present inventive concepts. FIG. 2 is a block diagram explaining the nonvolatile memory device of FIG. 1.

Referring to FIGS. 1 and 2, a nonvolatile memory device according to some example embodiments may include a cell region CELL and a peripheral circuit region PERI. The peripheral circuit region PERI may include a row decoder region ROW DCR, a page buffer region PBR and a column decoder region COL DCR.

The cell region CELL may include a cell array region CAR and a contact region CTR.

A memory cell array 1 including a plurality of memory cells may be formed in the cell array region CAR. The memory cell array 1 may include a plurality of memory cells and a plurality of word lines and bit lines electrically connected to the memory cells. In some example embodiments, the memory cell array 1 may include a plurality of memory blocks BLK0 to BLKn as data erase units. The memory cell array 1 will be further described later.

The contact region CTR may be interposed between the cell array region CAR and the peripheral circuit region PERI. For example, the contact region CTR may be interposed between the cell array region CAR and the row decoder region ROW DCR.

A row decoder 2 for selecting word lines of the memory cell array 1 may be disposed in the row decoder region ROW DCR. A contact wiring structure for electrically connecting the memory cell array 1 to the row decoder 2 may be formed in the contact region CTR. The row decoder 2 may select one of the memory blocks BLK0 to BLKn of the memory cell array 1 according to address information and select one of the word lines of the selected memory block. The row decoder 2 may provide a word line voltage generated from a voltage generating circuit (not shown) to the selected word line and unselected word lines, respectively, in response to control of a control circuit (not shown).

In the page buffer region PBR, a page buffer 3 may be formed to read information stored in the memory cells. The page buffer 3 may temporarily store data to be stored in the memory cells or sense data stored in the memory cells, according to an operation mode. The page buffer 3 may operate as a write driver circuit in a program operation mode and may operate as a sense amplifier circuit in a read operation mode.

A column decoder 4 connected to the bit lines of the memory cell array 1 may be formed in the column decoder region COL DCR. The column decoder 4 may provide a data transmission path between the page buffer 3 and an external device (e.g., a memory controller, not shown).

Figure 3:
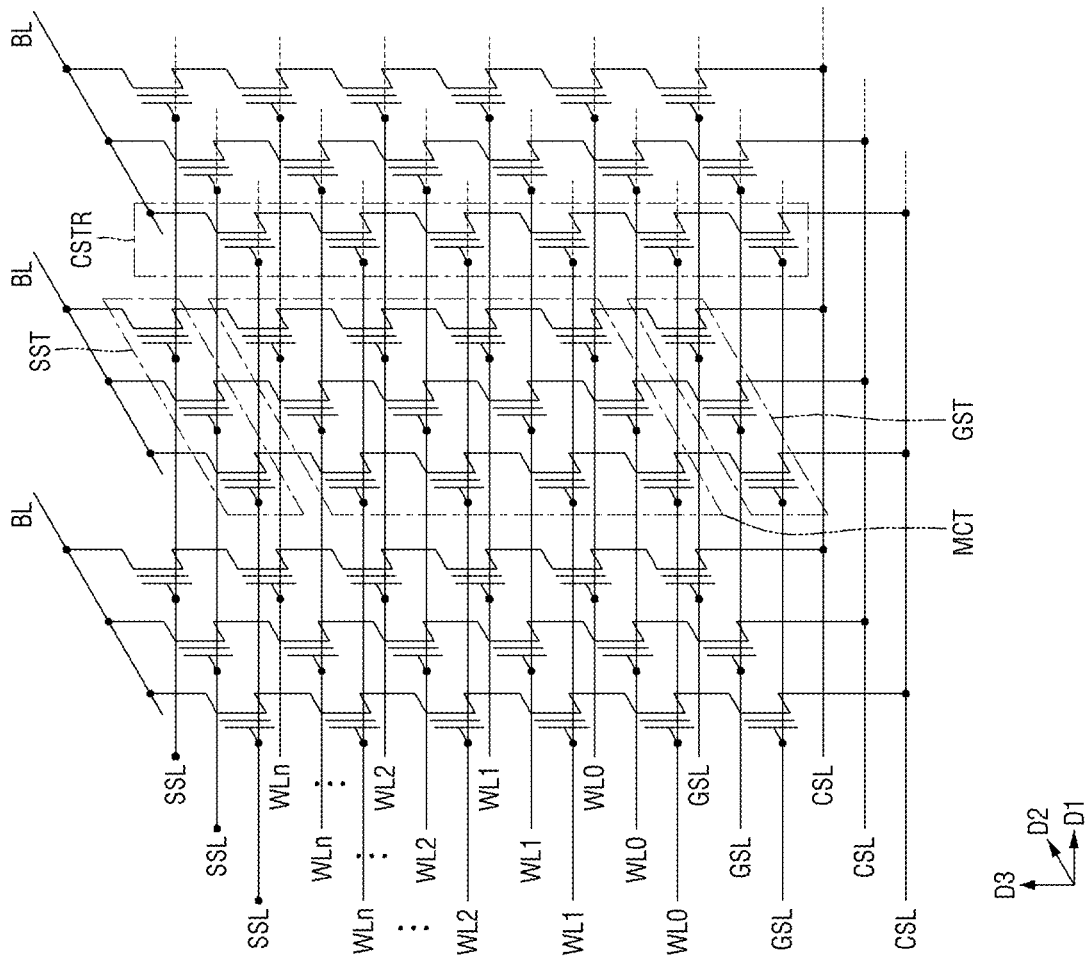
FIG. 3 is a schematic circuit diagram illustrating a memory cell array of a nonvolatile memory device according to some example embodiments of the present inventive concepts.

FIG. 3 is a schematic circuit diagram illustrating a memory cell array of a nonvolatile memory device according to some example embodiments of the present inventive concepts.

Referring to FIG. 3, a memory cell array of a nonvolatile memory device according to some example embodiments may include a common source line CSL, a plurality of bit lines BL and a plurality of cell strings CSTR.

The plurality of bit lines BL may be arranged two-dimensionally. For example, the bit lines BL may be separated from each other and extend in a first direction D2, respectively. The plurality of cell strings CSTR may be connected in parallel to each bit line BL. The cell strings CSTR may be connected in common to the common source line CSL. That is, the plurality of cell strings CSTR may be disposed between the plurality of bit lines BL and the common source line CSL.

In some example embodiments, a plurality of common source lines CSL may be arranged two-dimensionally. For example, the common source lines CSL may be separated from each other and extend in a second direction D1, respectively. Electrically the same voltage may be applied to the common source lines CSL, or different voltages may be applied to the common source lines CSL and controlled separately.

Each of the cell strings CSTR may include a ground selection transistor GST connected to the common source line CSL, a string selection transistor SST connected to the bit line BL, and a plurality of memory cell transistors MCT arranged between the ground selection transistor GST and the string selection transistor SST. Each of the memory cell transistors MCT may include a data storage element. The ground selection transistor GST, the string selection transistor SST, and the memory cell transistors MCT may be connected in series.

The common source line CSL may be connected in common to the sources of the ground selection transistors GST. Further, a ground selection line GSL, a plurality of word lines WL0-WLn and a string selection line SSL may be disposed between the common source line CSL and the bit lines BL. The ground selection line GSL may be used as the gate electrode of the ground selection transistor GST, the plurality of word lines WL0 to WLn may be used as the gate electrodes of the memory cell transistors MCT, and the string selection line SSL may be used as the gate electrode of the string selection transistor SST.

Figure 4:
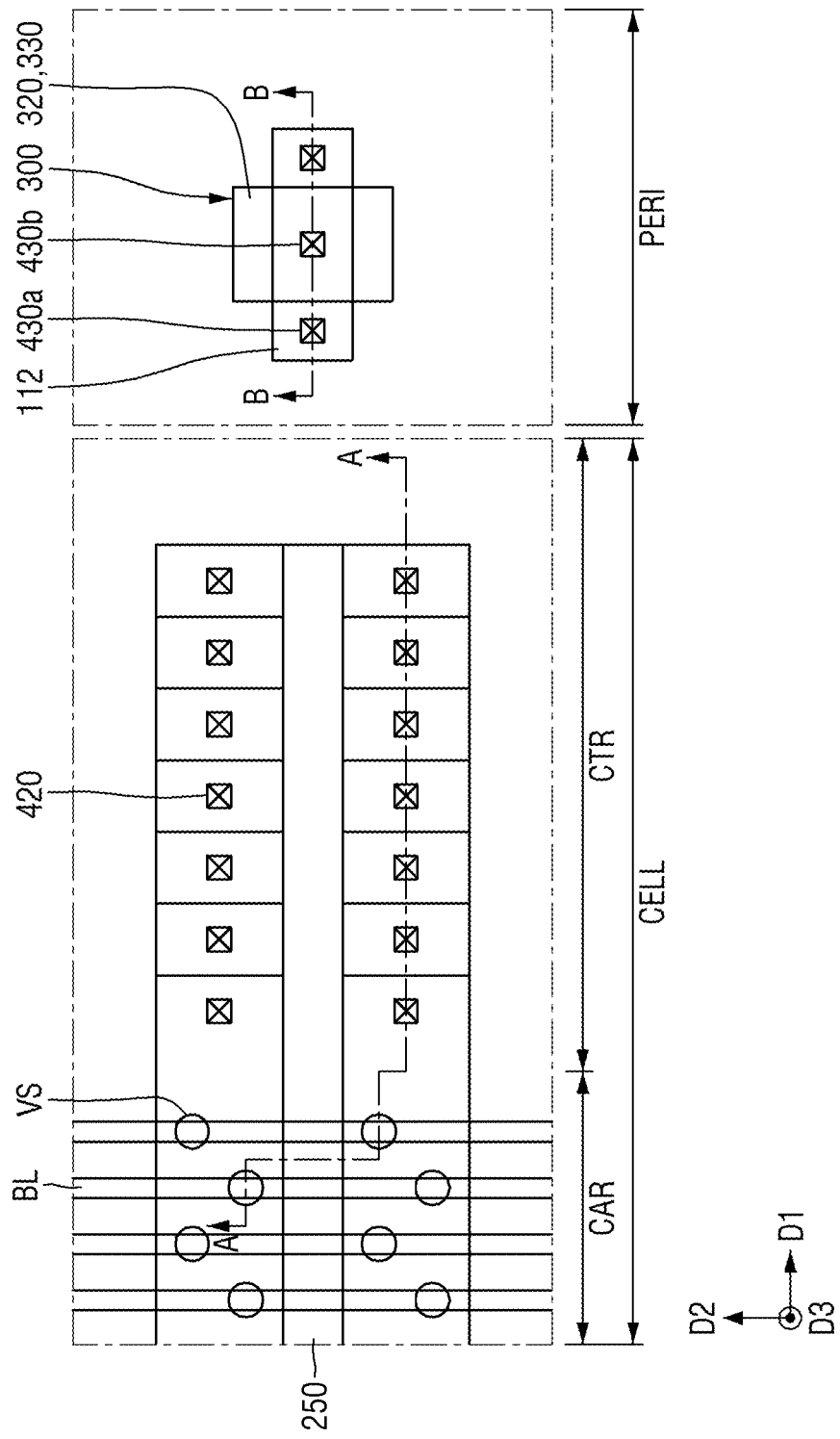
FIG. 4 is a layout diagram of a nonvolatile memory device according to some example embodiments of the present inventive concepts.
Figure 5:
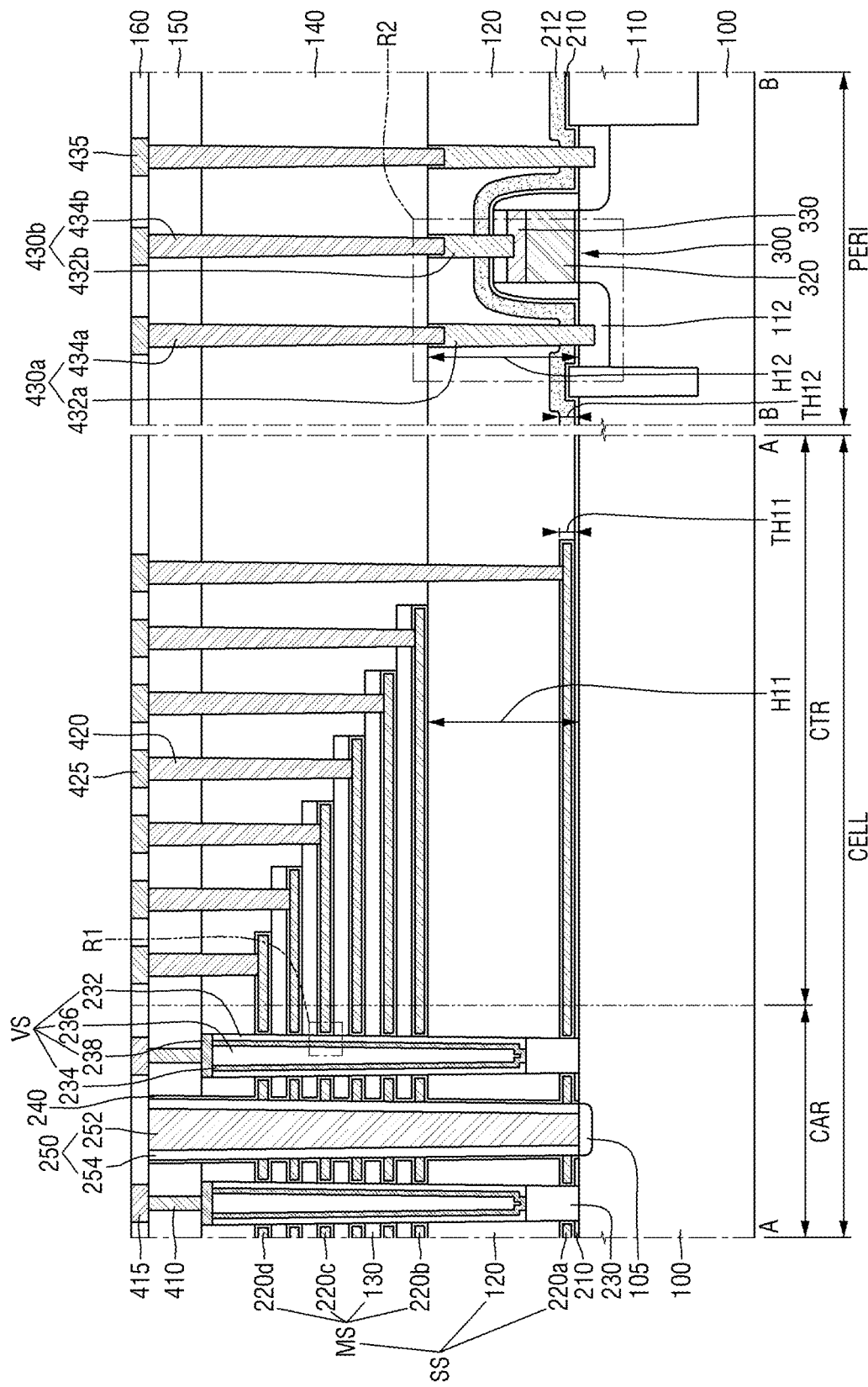
FIG. 5 is a cross-sectional view taken along lines A-A and B-B of FIG. 4.
Figure 6:
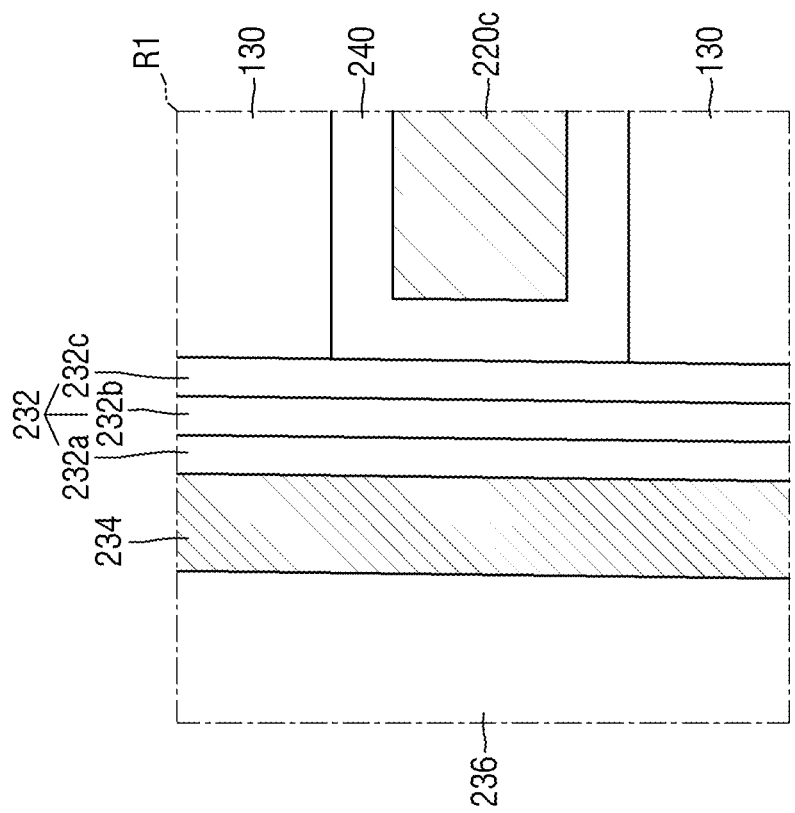
FIG. 6 is an enlarged view of region R1 of FIG. 5.

FIG. 4 is a layout diagram of a nonvolatile memory device according to some example embodiments of the present inventive concepts. FIG. 5 is a cross-sectional view taken along lines A-A and B-B of FIG. 4. FIG. 6 is an enlarged view of region R1 of FIG. 5. FIGS. 7A to 7E are various enlarged views of region R2 of FIG. 5.

Referring to FIGS. 4 to 7E, a nonvolatile memory device according to some example embodiments includes a substrate 100, a stacked structure SS, a vertical channel structure VS, a common source contact structure 250, an element isolation layer 110, a peripheral circuit element 300, a first sacrificial pattern 212, first to fourth interlayer insulating films 120, 140, 150 and 160, channel contacts 410, bit lines 415, cell contacts 420, first connection wirings 425, peripheral circuit contacts 430a and 430b, and second connection wirings 435.

The substrate 100 may include a semiconductor substrate such as a silicon substrate, a germanium substrate, or a silicon-germanium substrate, for example. Alternatively, the substrate 100 may include a silicon-on-insulator (SOI) substrate or a germanium-on-insulator (GOI) substrate.

The stacked structure SS may be formed on the substrate 100 of the cell region CELL. The stacked structure SS may include a plurality of gate patterns 220a, 220b, 220c and 220d, a first interlayer insulating film 120 of the cell region CELL, and a plurality of insulation patterns 130. The gate patterns 220a, 220b, 220c and 220d and the insulation patterns 130 may be elongated (or may extend) in a direction parallel to the top surface of the substrate 100.

The first gate pattern 220a disposed at the lowermost portion of the gate patterns 220a, 220b, 220c and 220d may extend along the top surface of the substrate 100. In some example embodiments, the first gate pattern 220a may be provided as the ground selection line GSL of FIG. 3. However, some other example embodiments of the present inventive concepts are not limited thereto. For example, in some other example embodiments, the first gate pattern 220a may be provided to the gate electrode of a transistor (e.g., a switch transistor) other than the gate electrode of the ground selection transistor GST of FIG. 3.

The first interlayer insulating film 120 may be formed on the substrate 100. The first interlayer insulating film 120 of the cell region CELL may cover the first gate pattern 220a.

The first interlayer insulating film 120 may include, for example, silicon oxide, but some other example embodiments of the present inventive concepts are not limited thereto.

The gate patterns 220b, 220c and 220d on the first interlayer insulating film 120 and the insulation patterns 130 may form a mold structure MS. The gate patterns 220b, 220c and 220d of the mold structure MS and the insulation patterns 130 may be stacked alternately and repeatedly.

The second gate pattern 220b disposed at the lowermost portion of the gate patterns 220b, 220c and 220d of the mold structure MS may extend along the top surface of the first interlayer insulating film 120. The mold structure MS may include a plurality of third gate patterns 220c separated from each other on the second gate pattern 220b and stacked in order. In some example embodiments, the second gate pattern 220b and the third gate pattern 220c may be provided as the word lines WL0 through WLn of FIG. 3. However, some other example embodiments of the present inventive concepts are not limited thereto. For example, in some other example embodiments, the second gate pattern 220b may be provided as the ground selection line GSL of FIG. 3.

The fourth gate pattern 220d disposed at the uppermost portion of the gate patterns 220b, 220c and 220d of the mold structure MS may extend along the top surface of the uppermost insulation pattern among the insulation patterns 130. In some example embodiments, the fourth gate pattern 220d may be provided as the string selection line SSL of FIG. 3.

Although it is illustrated that the gate patterns 220a, 220b, 220c and 220d have the same thickness, some other example embodiments of the present inventive concepts are not limited thereto. For example, in some other example embodiments, the gate patterns 220a, 220b, 220c and 220d may have different thicknesses.

The gate patterns 220a, 220b, 220c and 220d may include a conductive material. The gate patterns 220a, 220b, 220c and 220d may include a semiconductor material such as silicon or metal such as tungsten (W), cobalt (Co), and/or nickel (Ni), but some other example embodiments of the present inventive concepts are not limited thereto.

The insulation patterns 130 may include an insulating material. The plurality of insulation patterns 130 may include, for example, silicon oxide, but the present inventive concept is not limited thereto. In some embodiments, the insulation patterns 130 may have substantially the same material composition as the first interlayer insulating film 120. For example, the insulation patterns 130 may include the same material as silicon oxide included in the first interlayer insulating film 120.

The vertical channel structure VS may be connected to the substrate 100 through the stacked structure SS. For example, the vertical channel structure VS may be formed in a pillar shape on the substrate 100 to pass through the plurality of gate patterns 220a, 220b, 220c and 220d and the plurality of insulation patterns 130. Accordingly, the gate patterns 220a, 220b, 220c and 220d may intersect the vertical channel structure VS.

A plurality of vertical channel structures VS may be provided. Further, the plurality of vertical channel structures VS may be respectively disposed on both sides of the common source contact structure 250.

The vertical channel structure VS may include a first semiconductor pattern 234, a gap fill pattern 236, a second semiconductor pattern 230, a charge storage structure 232 and a channel pad 238.

The first semiconductor pattern 234 may be connected to the substrate 100 through the stacked structure SS. The first semiconductor pattern 234 may be formed, for example, in a cup shape. For example, the vertical channel structure VS may include the pillar-shaped gap fill pattern 236 and the first semiconductor pattern 234 extending conformally along the bottom and sidewalls of the gap fill pattern 236. The gap fill pattern 236 may include, for example, silicon oxide. However, some other example embodiments of the present inventive concepts are not limited thereto, and the first semiconductor pattern 234 may have various shapes such as a cylindrical shape, a rectangular tube shape, a stuffed pillar shape, and the like.

The first semiconductor pattern 234 may include a semiconductor material such as monocrystalline silicon, an organic semiconductor material and a carbon nanostructure, but some other example embodiments of the present inventive concepts are not limited thereto.

The second semiconductor pattern 230 may be interposed between the substrate 100 and the first semiconductor pattern 234. The second semiconductor pattern 230 may pass through, for example, the first gate pattern 220a. The second semiconductor pattern 230 may be electrically connected to the first semiconductor pattern 234. The second semiconductor pattern 230 may be formed on the substrate 100 by, for example, selective epitaxial growth (SEG). However, in some other example embodiments, the second semiconductor pattern 230 may be omitted.

The second semiconductor pattern 230 may include, for example, a single crystal intrinsic semiconductor material with the same conductivity type as the substrate 100 (e.g., a p-type semiconductor material).

The charge storage structure 232 may be interposed between the first semiconductor pattern 234 and the stacked structure SS. For example, the charge storage structure 232 may be interposed between the first semiconductor pattern 234 and the gate patterns 220b, 220c and 220d of the mold structure MS.

In some example embodiments, the charge storage structure 232 may include a plurality of films. For example, as shown in FIG. 6, the charge storage structure 232 may include a tunnel insulating film 232a, a charge storage film 232b, and a blocking insulating film 232c that are sequentially stacked on the first semiconductor pattern 234.

The charge storage structure 232 may include, for example, at least one of silicon oxide, silicon nitride, silicon oxynitride, and/or a high-k material having a higher dielectric constant than that of silicon oxide. For example, the tunnel insulating film 232a may include silicon oxide or a high-k material (for example, aluminum oxide ($Al_2O_3$) and/or hafnium oxide ($HfO_2$)). For example, the charge storage film 232b may include silicon nitride. For example, the blocking insulating film 232c may include silicon oxide or a high-k material (for example, aluminum oxide ($Al_2O_3$) and/or hafnium oxide ($HfO_2$)).

The channel pad 238 may be formed on the vertical channel structure VS. The channel pad 238 may be connected to the first semiconductor pattern 234. Although it is illustrated in FIG. 5 that the channel pad 238 is disposed on the top surfaces of the first semiconductor pattern 234, the charge storage structure 232, and the gap fill pattern 236, some other example embodiments of the present inventive concepts are not limited thereto. For example, unlike the illustrated example embodiment, an upper portion of the first semiconductor pattern 234 may be formed to extend along the sidewalls of the channel pad 238.

The channel pad 238 may include a conductive material. The channel pad 238 may include, for example, impurity-doped polysilicon, but some other example embodiments of the present inventive concepts are not limited thereto.

In some example embodiments, a first gate insulating layer 240 may be formed between the charge storage structure 232 and the gate patterns 220a, 220b, 220c and 220d.

For simplicity of description, the first gate insulating layer 240 will be described as being included in the gate patterns 220a, 220b, 220c and 220d. For example, the thickness of the gate patterns 220a, 220b, 220c and 220d may refer to the sum of the thicknesses of the respective gate patterns 220a, 220b, 220c and 220d and the thickness of the first gate insulating layer 240 surrounding the respective gate patterns 220a, 220b, 220c and 220d.

The first gate insulating layer 240 may include, for example, silicon oxide or a high-k material (for example, aluminum oxide ($Al_2O_3$) and/or hafnium oxide ($HfO_2$)).

The common source contact structure 250 may be connected to a first impurity region 105 in the substrate 100 through the stacked structure SS. The first impurity region 105 may extend in the second direction D1, for example. The common source contact structure 250 and/or the first impurity region 105 may be provided as the common source line CSL of FIG. 1.

In some example embodiments, the common source contact structure 250 may include a common source plug pattern 252 and a common source spacer 254. The common source plug pattern 252 may be connected to the first impurity region 105 in the substrate 100 through the stacked structure SS. The common source plug pattern 252 may include a conductive material. The common source spacer 254 may extend along the sidewall of the common source plug pattern 252. The common source spacer 254 may include an insulating material.

The peripheral circuit element 300 may be formed on the substrate 100 in the peripheral circuit region PERI. For example, the peripheral circuit element 300 may be formed on an active region of the substrate 100 defined by the element isolation layer 110 in the peripheral circuit region PERI.

In the following description, the peripheral circuit element 300 is described as being a transistor, but this is merely exemplary, and some other example embodiments of the present inventive concepts are not limited thereto. For example, the peripheral circuit element 300 may include various passive elements such as a capacitor, a resistor, and/or an inductor, as well as various active elements such as a transistor.

In some example embodiments, the peripheral circuit element 300 may be a high voltage transistor or a low voltage transistor. For example, the peripheral circuit element 300 may include peripheral circuit gate patterns 320 and 330, a second gate insulating layer 310, a capping pattern 340, gate spacers 350, and a second impurity region 112.

The peripheral circuit gate patterns 320 and 330 may be formed on the substrate 100 of the peripheral circuit region PERI. The peripheral circuit gate patterns 320 and 330 may be formed on the active region of the substrate 100 defined by the element isolation layer 110. Although it is illustrated in FIGS. 4 and 5 that the peripheral circuit gate patterns 320 and 330 extend in the first direction D2, this is merely exemplary, and some other example embodiments of the present inventive concepts are not limited thereto. For example, the peripheral circuit gate patterns 320 and 330 may extend in a direction different from the first direction D2.

The peripheral circuit gate patterns 320 and 330 may include a conductive material. In some example embodiments, the peripheral circuit gate patterns 320 and 330 may include a plurality of conductive films. For example, the peripheral circuit gate patterns 320 and 330 may include a first conductive layer 320 and a second conductive layer 330 that are sequentially stacked on the substrate 100. The first conductive layer 320 may include, for example, polysilicon, and the second conductive layer 330 may include, for example, a metal material.

The second gate insulating layer 310 may be interposed between the substrate 100 and the peripheral circuit gate patterns 320 and 330. For example, the second gate insulating layer 310 may extend along the top surface of the substrate 100 in the peripheral circuit region PERI.

The second gate insulating layer 310 may include, for example, at least one of silicon oxide, silicon nitride, silicon oxynitride, and/or a high-k material having a higher dielectric constant than that of silicon oxide.

The capping pattern 340 may be formed on the top surface of the peripheral circuit gate patterns 320 and 330. The capping pattern 340 may include, but is not limited to, a hard mask material, for example.

The gate spacers 350 may be formed on both sidewalls of the peripheral circuit gate patterns 320 and 330. For example, the second gate insulating layer 310, the peripheral circuit gate patterns 320 and 330, and the capping pattern 340 may be formed to fill a trench formed by the top surface of the substrate 100 and the inner sidewalls of the gate spacers 350.

The second impurity region 112 may be formed in the substrate 100 on both sides of the peripheral circuit gate patterns 320 and 330. The second impurity region 112 may be formed in the active region of the substrate 100 defined by the element isolation layer 110. The second impurity region 112 may be doped with impurities. For example, when the peripheral circuit element 300 is an n-type (or p-type) transistor, the second impurity region 112 may be doped with p-type (or n-type) impurities.

In some example embodiments, the second impurity region 112 may be a shallow junction formed in the substrate.

The first sacrificial pattern 212 may be formed on the substrate 100 and the peripheral circuit element 300 of the peripheral circuit region PERI. The first sacrificial pattern 212 may extend conformally along the substrate 100 and the peripheral circuit element 300 of the peripheral circuit region PERI.

The first sacrificial pattern 212 may include a material different from the first interlayer insulating film 120. The first sacrificial pattern 212 may include a material having an etch selectivity with respect to the first interlayer insulating film 120. For example, in a case where the first interlayer insulating film 120 includes silicon oxide, the first sacrificial pattern 212 may include silicon nitride.

In some example embodiments, a thickness TH11 of the first gate pattern 220a (e.g., the ground selection line GSL) may be substantially equal to a thickness TH12 of the first sacrificial pattern 212. The term "same" used herein not only means being completely identical but also includes a minute difference that may occur due to a process margin and the like. A description thereof will be given later with reference to FIGS. 14 to 29.

The first interlayer insulating film 120 of the peripheral circuit region PERI may be formed on the first sacrificial pattern 212. Accordingly, the first interlayer insulating film 120 of the cell region CELL may cover the first gate pattern 220a (e.g., the ground selection line GSL), and the first interlayer insulating film 120 of the peripheral circuit region PERI may cover the peripheral circuit element 300 (e.g., a transistor).

In some example embodiments, with respect to the top surface of the substrate 100, a height H11 of the bottom surface of the second gate pattern 220b (e.g., the lowermost word line WL0) of the cell region CELL may be substantially equal to a height H12 of the top surface of the first interlayer insulating film 120 of the peripheral circuit region PERI. This can be attributed to, for example, a planarization process performed on the first interlayer insulating film 120.

In some example embodiments, a buffer insulating layer 210 may be formed on the substrate 100. The buffer insulating layer 210 may extend conformally along the top surface of the substrate 100 of the cell region CELL and the peripheral circuit region PERI. Further, the buffer insulating layer 210 may extend conformally along the top surface of the element isolation layer 110 and the peripheral circuit element 300.

The buffer insulating layer 210 may include, for example, silicon oxide, but some other example embodiments of the present inventive concepts are not limited thereto.

A second interlayer insulating film 140 may be formed on the first interlayer insulating film 120. The second interlayer insulating film 140 may cover the first interlayer insulating film 120 and the mold structure MS. The second interlayer insulating film 140 may include, for example, silicon oxide, but some other example embodiments of the present inventive concepts are not limited thereto.

In some example embodiments, the first interlayer insulating film 120 and the second interlayer insulating film 140 may include different materials from each other. For example, the first interlayer insulating film 120 and the second interlayer insulating film 140 may include different silicon oxides, respectively.

The channel contacts 410 may be formed on the channel pad 238. The channel contacts 410 may be connected to the channel pad 238. For example, the channel contacts 410 may be connected to the channel pad 238 through the third interlayer insulating film 150 on the second interlayer insulating film 140.

The bit lines 415 may be formed on the channel contacts 410. For example, the bit lines 415 may be formed in the fourth interlayer insulating film 160 on the third interlayer insulating film 150. The bit lines 415 may be connected to the channel contacts 410. Accordingly, the bit lines 415 can be electrically connected to the substrate 100 and the vertical channel structure VS.

The cell contacts 420 may be formed on end portions of the gate patterns 220a, 220b, 220c and 220d. The plurality of cell contacts 420 may be connected to the gate patterns 220a, 220b, 220c and 220d, respectively. For example, the respective cell contacts 420 may be connected to the respective gate patterns 220a, 220b, 220c and 220d through the second interlayer insulating film 140 and the third interlayer insulating film 150.

In some example embodiments, a portion of the plurality of cell contacts 420 may be connected to an end portion of the first gate pattern 220a through the first interlayer insulating film 120, the second interlayer insulating film 140, and the third interlayer insulating film 150.

In some example embodiments, the channel contacts 410 and the cell contacts 420 may have substantially the same material composition. For example, the cell contacts 420 may include the same material as the conductive material included in the channel contacts 410.

The first connection wirings 425 may be formed on the cell contacts 420. For example, the first connection wirings 425 may be formed in the fourth interlayer insulating film 160 on the third interlayer insulating film 150. The first connection wirings 425 may be connected to the cell contacts 420, respectively. Accordingly, the first connection wirings 425 may be electrically connected to the gate patterns 220a, 220b, 220c and 220d, respectively.

The peripheral circuit contacts 430a and 430b may be formed on the peripheral circuit element 300. The peripheral circuit contacts 430a and 430b may be connected to peripheral circuit element 300. For example, the peripheral circuit contacts 430a and 430b may include a first peripheral circuit contact 430a connected to the second impurity region 112 of the peripheral circuit element 300, and a second peripheral circuit contact 430b connected to the peripheral circuit gate patterns 320 and 330 of the peripheral circuit element 300. The first peripheral circuit contact 430a and the second peripheral circuit contact 430b may be separated from each other.

In some example embodiments, the peripheral circuit contacts 430a and 430b may have substantially the same material composition as the channel contacts 410 and the cell contacts 420. For example, the peripheral circuit contacts 430a and 430b may include the same material as the conductive material included in the cell contacts 420 and the channel contacts 410.

The peripheral circuit contacts 430a and 430b may include lower contacts 432a and 432b and upper contacts 434a and 434b.

The lower contacts 432a and 432b may be connected to the peripheral circuit element 300 through the first interlayer insulating film 120 and the first sacrificial pattern 212. For example, the lower contacts 432a and 432b may include a first lower contact 432a connected to the second impurity region 112 through the first interlayer insulating film 120, the first sacrificial pattern 212, and the buffer insulating layer 210, and a second lower contact 432b connected to the peripheral circuit gate patterns 320 and 330 through the first interlayer insulating film 120, the first sacrificial pattern 212, and the buffer insulating layer 210. The first lower contact 432a and the second lower contact 432b may be separated from each other.

The height of the top surfaces of the lower contacts 432a and 432b may be substantially the same as the height of the top surface of the first interlayer insulating film 120. For example, the height of the top surfaces of the lower contacts 432a and 432b may be substantially the same as the height H11 of the first interlayer insulating film 120 of the cell region CELL and the height H12 of the first interlayer insulating film 120 of the peripheral circuit region PERI.

The height of the top surfaces of the lower contacts 432a and 432b may be equal to or lower than the height of the bottom surface of the gate pattern disposed at the lowermost portion of the gate patterns 220b, 220c and 220d on the first interlayer insulating film 120 of the cell region CELL. For example, the height of the top surfaces of the lower contacts 432a and 432b may be equal to or lower than the height of the bottom surface of the second gate pattern 220b (e.g., the lowermost word line WL0) disposed at the lowermost portion of the gate patterns 220b, 220c and 220d of the mold structure MS. For example, the top surfaces of the lower contacts 432a and 432b may be disposed substantially on the same plane as the top surface of the first interlayer insulating film 120.

The upper contacts 434a and 434b may be connected to the lower contacts 432a and 432b through the second interlayer insulating film 140. For example, the upper contacts 434a and 434b may include a first upper contact 434a connected to the first lower contact 432a through the second interlayer insulating film 140 and the third interlayer insulating film 150, and a second upper contact 434b connected to the second lower contact 432b through the second interlayer insulating film 140 and the third interlayer insulating film 150. The first upper contact 434a and the second upper contact 434b may be separated from each other.

The widths of the lower contacts 432a and 432b may increase in a direction away from the top surface of the substrate 100. The term "width" as used herein means a width in a direction parallel to the top surface of the substrate 100. This can be attributed to, for example, the characteristics of an etching process for forming the lower contacts 432a and 432b. Similarly, the widths of the upper contacts 434a and 434b may increase in the direction away from the top surface of the substrate 100.

Figure 7A:
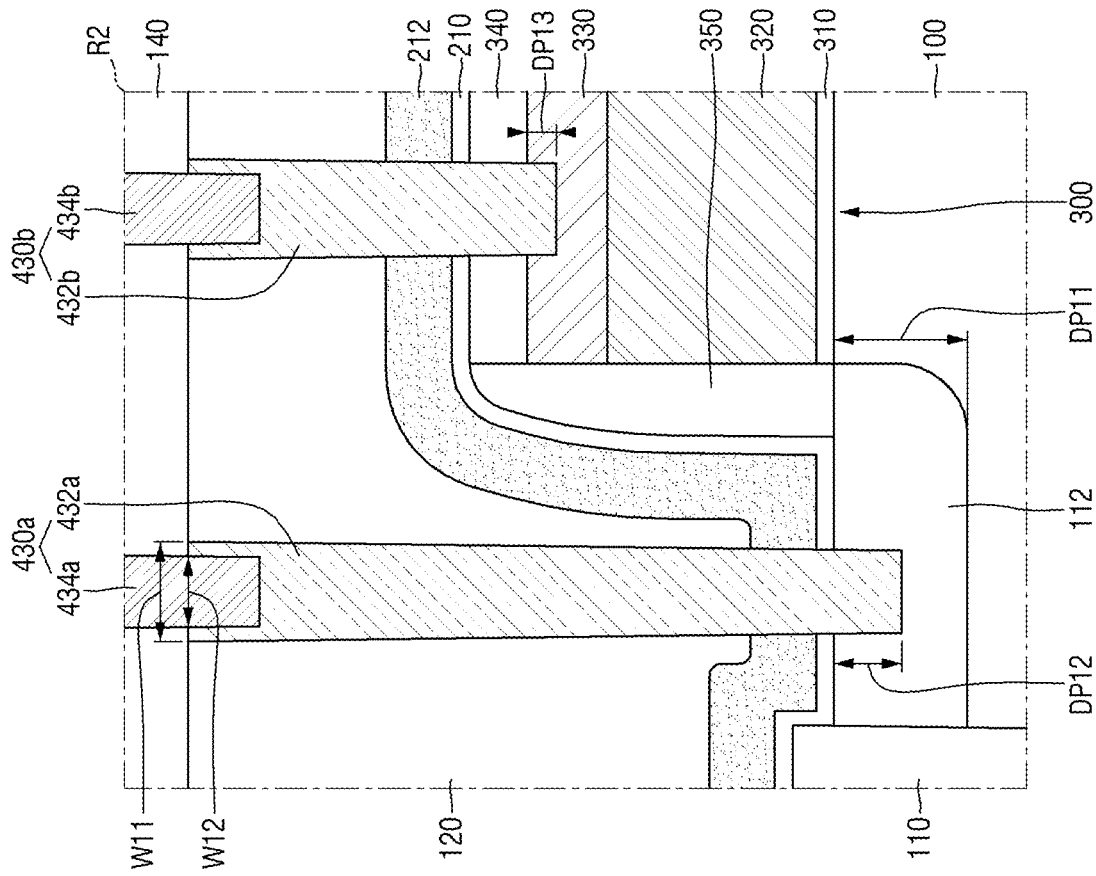
FIGS. 7A to 7E are various enlarged views of region R2 of FIG. 5.

In some example embodiments, at the same level as the top surface of the first interlayer insulating film 120, the width of the lower contacts 432a and 432b may be greater than the width of the upper contacts 434a and 434b. For example, as shown in FIG. 7A, at the same level as the top surface of the first interlayer insulating film 120, a width W11 of the first lower contact 432a may be greater than a width W12 of the first upper contact 434a. Accordingly, the upper contacts 434a and 434b can be easily connected to the lower contacts 432a and 432b.

In some example embodiments, the first lower contact 432a may not completely pass through the second impurity region 112. For example, as shown in FIG. 7A, with respect to the top surface of the substrate 100, a depth DP11 of the bottom surface of the second impurity region 112 may be smaller than a depth DP12 of the bottom surface of the first lower contact 432a.

In some example embodiments, a depth of the first lower contact 432a passing through the second impurity region 112 may be different from a depth of the second lower contact 432b passing through the peripheral circuit gate patterns 320 and 330. For example, as shown in FIG. 7A, a depth DP12 from the top surface of the second impurity region 112 to the bottom surface of the first lower contact 432a may be different from a depth DP13 from the top surface of the peripheral circuit gate patterns 320 and 330 to the bottom surface of the second lower contact 432b.

Figure 7B:
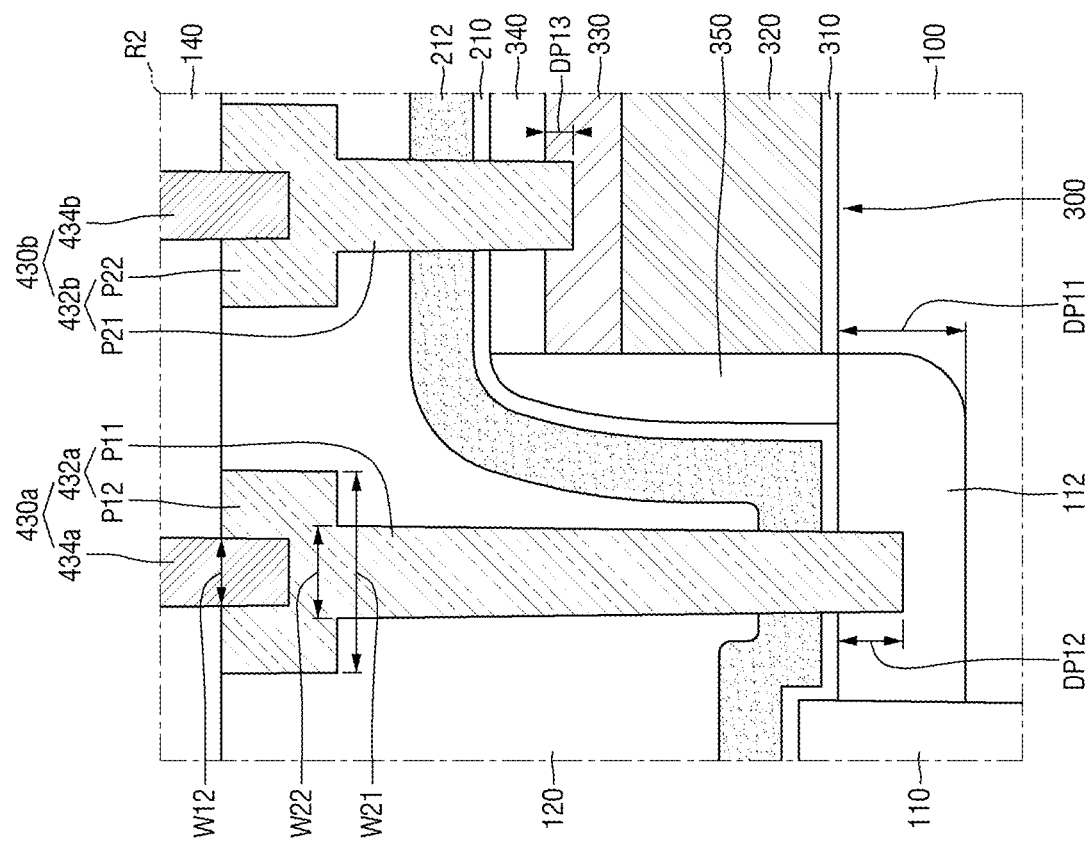

Referring to FIG. 7B, in a nonvolatile memory device according to some example embodiments, the lower contacts 432a and 432b may include first portions P11 and P21 and second portions P12 and P22.

For example, the first lower contact 432a may include a first portion P11 connected to the second impurity region 112 through the first interlayer insulating film 120, the first sacrificial pattern 212, and the buffer insulating layer 210, and a second portion P12 connected to the first upper contact 434a on the first portion P11. For example, the second lower contact 432b may include a first portion P21 connected to the peripheral circuit gate patterns 320 and 330 through the first interlayer insulating film 120, the first sacrificial pattern 212 and the buffer insulating layer 210, and a second portion P22 connected to the second upper contact 434b on the first portion P21.

In some example embodiments, the width of the second portions P12 and P22 may be greater than the width of the first portions P11 and P21. For example, a width W21 of the lowermost portion of the second portion P12 may be greater than a width W22 of the uppermost portion of the first portion P11. Accordingly, the upper contacts 434a and 434b can be easily connected to the lower contacts 432a and 432b.

Figure 7C:
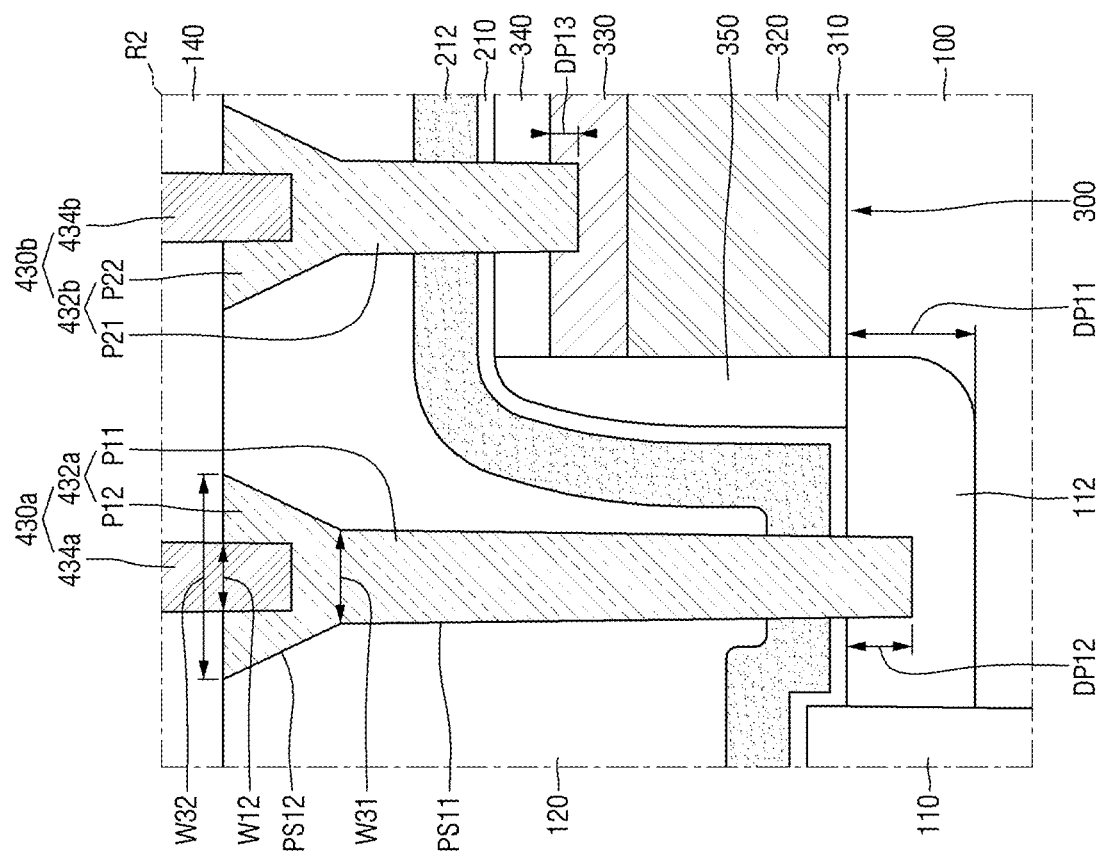

Referring to FIG. 7C, in a nonvolatile memory device according to some example embodiments, the slope of the sidewalls of the second portions P12 and P22 may be smaller than the slope of the sidewalls of the first portions P11 and P21.

For example, with respect to the top surface of the substrate 100, the slope of a sidewall PS12 of the second portion P12 may be smaller than the slope of a sidewall PS11 of the first portion P11. Thus, in some example embodiments, a width W32 of the uppermost portion of the second portion P12 may be greater than a width W31 of the uppermost portion of the first portion P11. Accordingly, the upper contacts 434a and 434b can be easily connected to the lower contacts 432a and 432b.

Figure 7D:
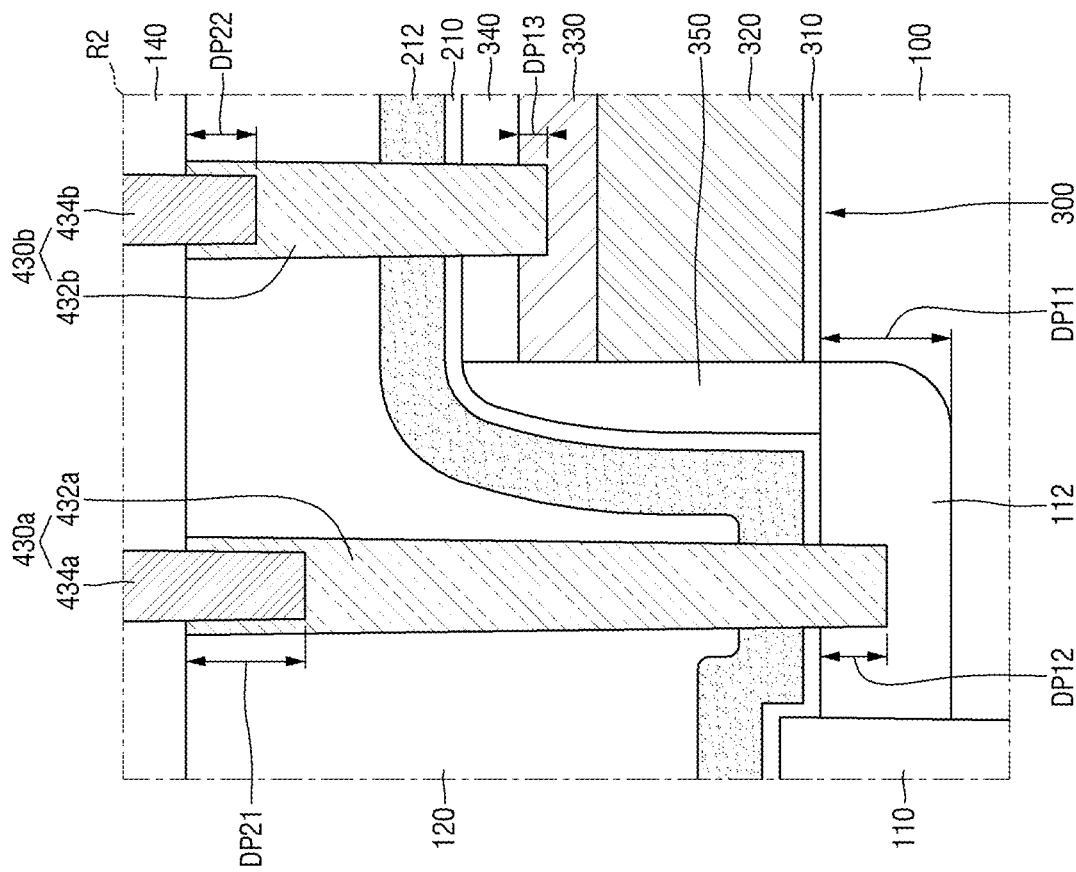

Referring to FIG. 7D, in a nonvolatile memory device according to some example embodiments, a depth of the first upper contact 434a passing through (or penetrating) the first lower contact 432a may be different from a depth of the second upper contact 434b passing through (or penetrating) the second lower contact 432b.

For example, with respect to the top surface of the first interlayer insulating film 120, a depth DP21 of the bottom surface of the first upper contact 434a may be different from a depth DP22 of the bottom surface of the second upper contact 434b. Although it is illustrated in FIG. 7 that the depth DP21 of the bottom surface of the first upper contact 434a is greater than the depth DP22 of the bottom surface of the second upper contact 434b, this is merely exemplary, and in some other example embodiments the depth DP21 of the bottom surface of the first upper contact 434a may be smaller than the depth DP22 of the bottom surface of the second upper contact 434b.

Figure 7E:
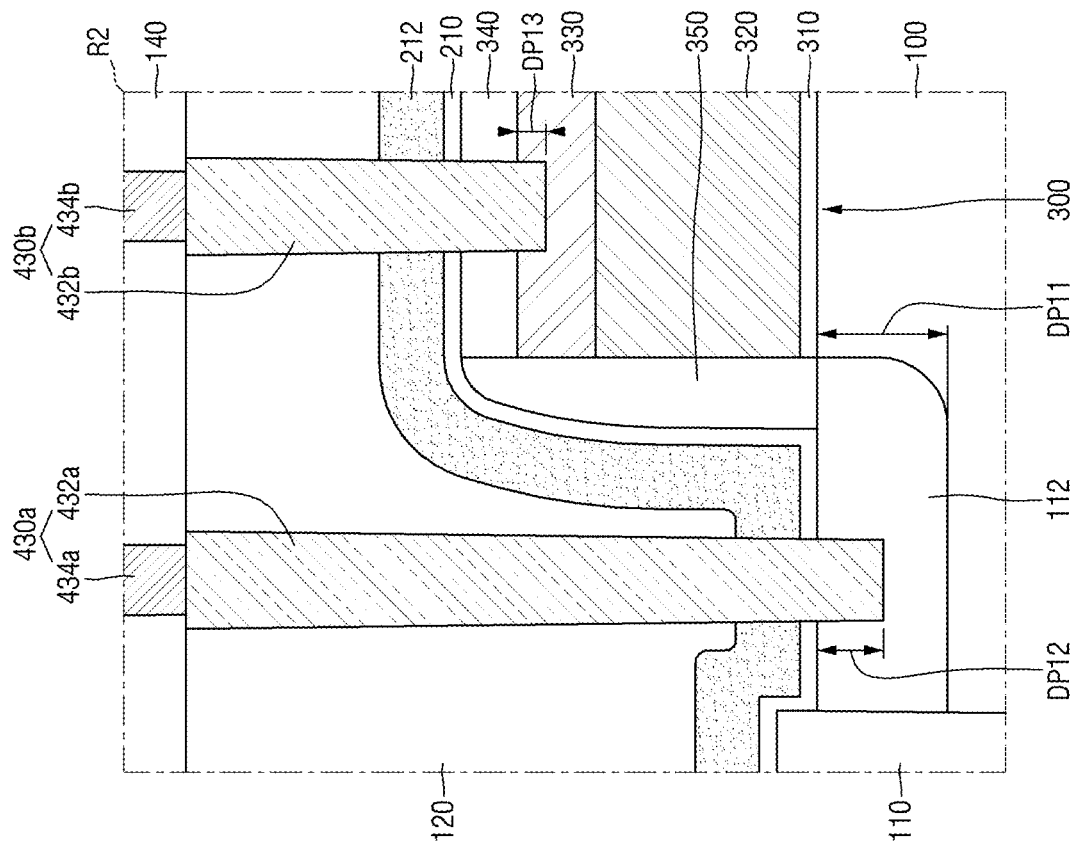

Referring to FIG. 7E, in a nonvolatile memory device according to some example embodiments, the upper contacts 434a and 434b may not pass through (or penetrate) the lower contacts 432a and 432b. For example, the height of the bottom surface of the upper contacts 434a and 434b may be substantially the same as the height of the top surface of the first interlayer insulating film 120.

The second connection wirings 435 may be formed on the peripheral circuit contacts 430a and 430b. For example, the second connection wirings 435 may be formed in the fourth interlayer insulating film 160 on the third interlayer insulating film 150. The second connection wirings 435 may be connected to the peripheral circuit contacts 430a and 430b. Accordingly, the second connection wirings 435 may be electrically connected to the peripheral circuit element 300 via the peripheral circuit contacts 430a and 430b.

As a nonvolatile memory device becomes highly integrated, a contact with a high aspect ratio (AR) is required. However, a contact with a high aspect ratio has a problem in that it is difficult to control the penetration depth, which may cause a defect in a nonvolatile memory device. For example, since it is difficult to control the penetration depth of a contact with a high aspect ratio, such contact may completely pass through a shallow junction (e.g., the second impurity region 112) in the substrate of the peripheral circuit region, which may cause a defect in a nonvolatile memory device.

However, in a nonvolatile memory device according to some example embodiments, the peripheral circuit contacts 430a and 430b may include the lower contacts 432a and 432b whose top surfaces are lower than or equal to the bottom surface of the mold structure MS. That is, the lower contacts 432a and 432b can be formed regardless of the aspect ratio of the mold structure. Accordingly, the peripheral circuit contacts 430a and 430b, for which it is relatively easy to control the penetration depth in the peripheral circuit region PERI (e.g., as compared to a contact with a high aspect ratio), can be formed, and a nonvolatile memory device with improved integration degree, reliability, and performance can be provided.

Figure 8:
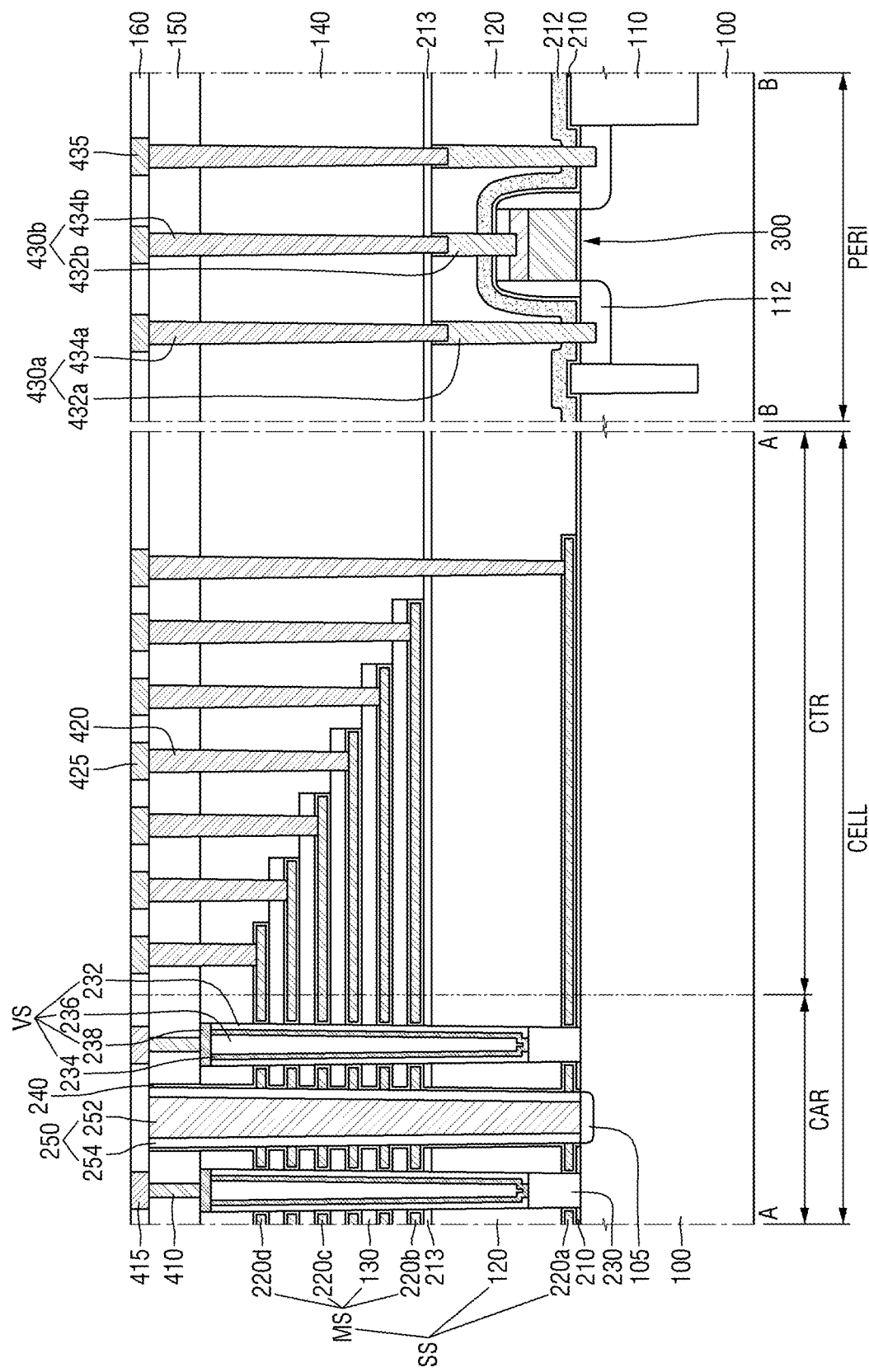
FIG. 8 is a cross-sectional view of a nonvolatile memory device according to some example embodiments of the present inventive concepts.

FIG. 8 is a cross-sectional view of a nonvolatile memory device according to some example embodiments of the present inventive concepts. For reference, FIG. 8 represents cross-sectional views taken along lines A-A and B-B of FIG. 4. For simplicity of description, a description overlapping with the description with reference to FIGS. 1 to 7E will be briefly given or omitted.

Referring to FIG. 8, the nonvolatile memory device according to some example embodiments further includes a first insertion insulating layer 213.

The first insertion insulating layer 213 may be formed on the first interlayer insulating film 120. For example, the first insertion insulating layer 213 may conformally extend along the top surface of the first interlayer insulating film 120 of the cell region CELL and the peripheral circuit region PERI.

The first insertion insulating layer 213 of the cell region CELL may be interposed between the first interlayer insulating film 120 and the mold structure MS. Further, the first insertion insulating layer 213 of the peripheral circuit region PERI may be interposed between the first interlayer insulating film 120 and the second interlayer insulating film 140. Accordingly, the height of the top surfaces of the lower contacts 432a and 432b may be lower than the height of the bottom surface of the gate pattern disposed at the lowermost portion of the gate patterns 220b, 220c and 220d on the first interlayer insulating film 120. For example, the height of the top surfaces of the lower contacts 432a and 432b may be lower than the height of the bottom surface of the second gate pattern 220b (e.g., the lowermost word line WL0)

disposed at the lowermost portion of the gate patterns 220b, 220c and 220d of the mold structure MS.

The first insertion insulating layer 213 may include, for example, at least one of silicon oxide, silicon nitride, and/or silicon oxynitride, but some other example embodiments of the present inventive concepts are not limited thereto.

Figure 9:
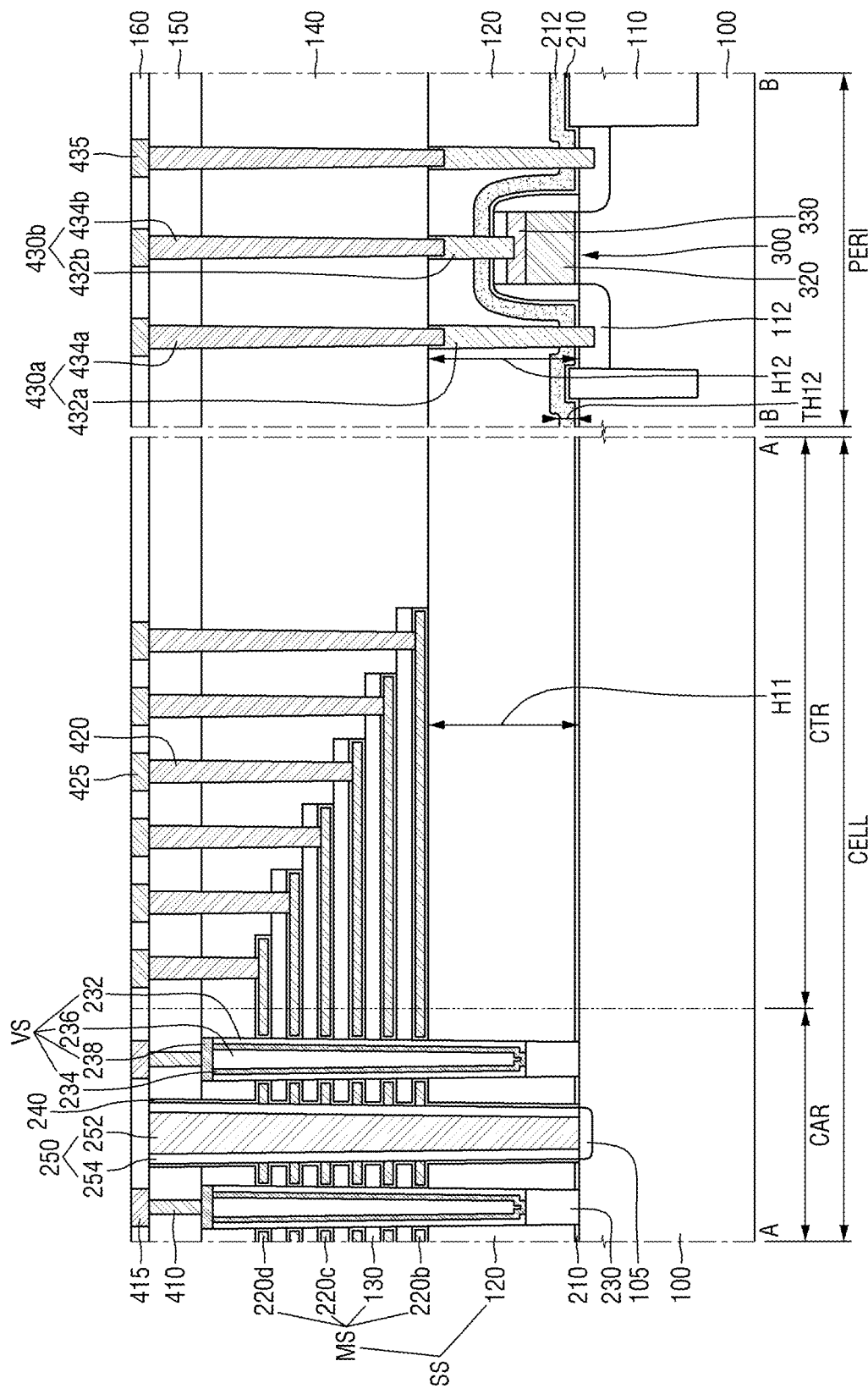
FIG. 9 is a cross-sectional view of a nonvolatile memory device according to some example embodiments of the present inventive concepts.

FIG. 9 is a cross-sectional view of a nonvolatile memory device according to some example embodiments of the present inventive concepts. For reference, FIG. 9 represents cross-sectional views taken along lines A-A and B-B of FIG. 4. For simplicity of description, a description overlapping with the description with reference to FIGS. 1 to 7E will be briefly given or omitted.

Referring to FIG. 9, in a nonvolatile memory device according to some example embodiments, all the gate patterns 220b, 220c and 220d are formed on the first interlayer insulating film 120.

For example, a gate pattern may not be formed in the first interlayer insulating film 120. For example, the first gate pattern 220a formed in the first interlayer insulating film 120 of FIG. 5 may be omitted. Thus, in some example embodiments, the height of the top surfaces of the lower contacts 432a and 432b may be lower than or equal to the height of the bottom surface of the second gate pattern 220b disposed at the lowermost portion of all the gate patterns 220b, 220c and 220d.

In some example embodiments, the second gate pattern 220b may be provided as the ground selection line GSL of FIG. 3 and the third gate pattern 220c may be provided as the word lines WL0 to WLn of FIG. 3.

In some example embodiments, with respect to the top surface of the substrate 100, the height H11 of the bottom surface of the second gate pattern 220b disposed at the lowermost portion of all the gate patterns 220b, 220c and 220d may be substantially equal to the height H12 of the top surface of the first interlayer insulating film 120 of the peripheral circuit region PERI.

Figure 10:
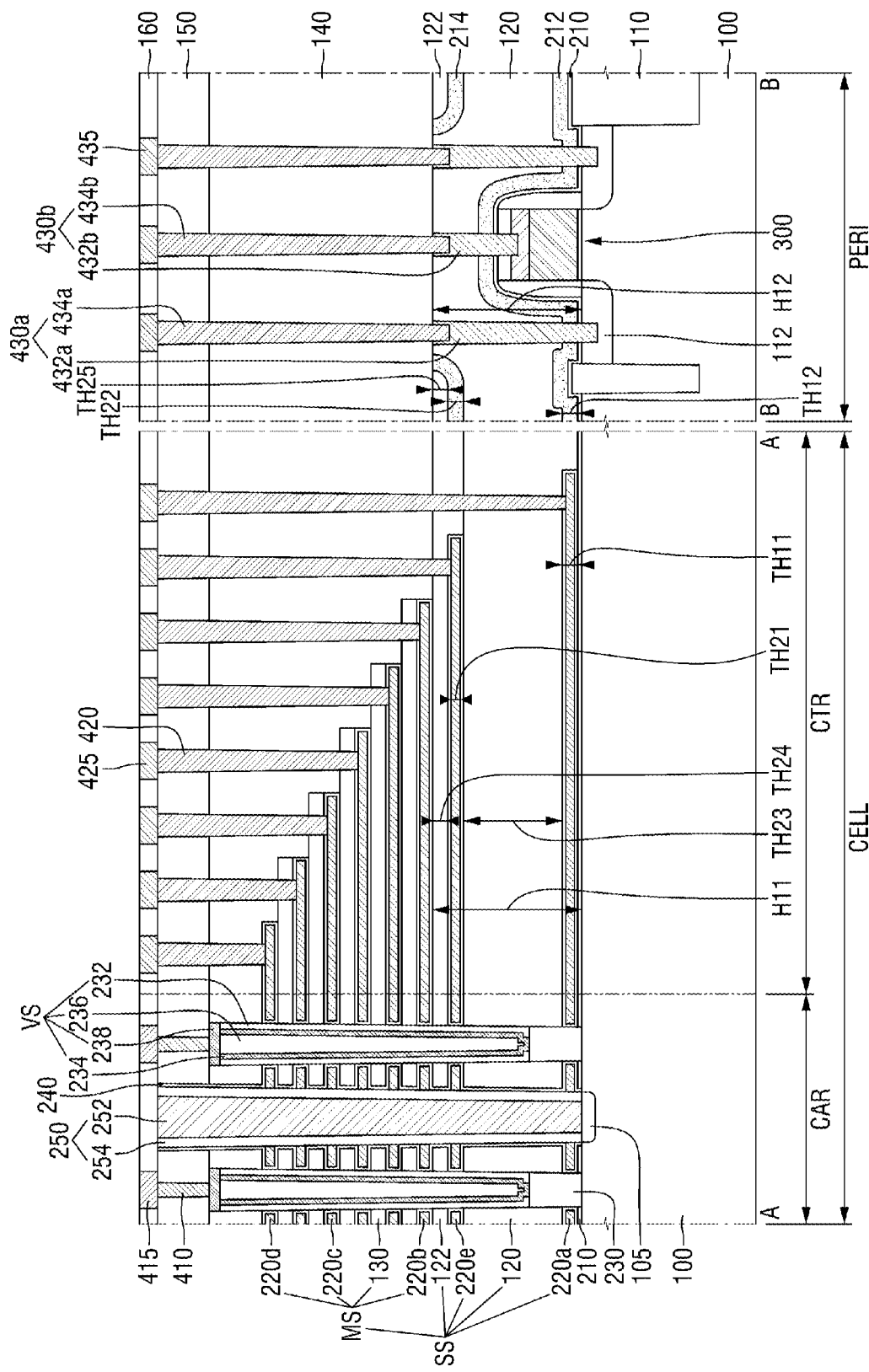
FIG. 10 is a cross-sectional view of a nonvolatile memory device according to some example embodiments of the present inventive concepts.

FIG. 10 is a cross-sectional view of a nonvolatile memory device according to some example embodiments of the present inventive concepts. For simplicity of description, a description overlapping with the description with reference to FIGS. 1 to 7E will be briefly given or omitted.

Referring to FIG. 10, a nonvolatile memory device according to some example embodiments further includes a fifth gate pattern 220e, a second sacrificial pattern 216, and a second insertion insulating layer 122.

The fifth gate pattern 220e may be formed on the first interlayer insulating film 120 of the cell region CELL. The fifth gate pattern 220e may be interposed between the first gate pattern 220a and the second gate pattern 220b. Accordingly, the fifth gate pattern 220e and the second insertion insulating layer 122 may constitute the stacked structure SS. In some example embodiments, the fifth gate pattern 220e may be provided as a dummy word line. For example, the fifth gate pattern 220e may not be the word line selected by the row decoder 2 of FIG. 2.

The second sacrificial pattern 216 may be formed on the first interlayer insulating film 120 of the peripheral circuit region PERI. The second sacrificial pattern 216 may conformally extend along at least a portion of the top surface of the first interlayer insulating film 120 of the peripheral circuit region PERI.

The second sacrificial pattern 216 may include a material different from that of the first interlayer insulating film 120. The second sacrificial pattern 216 may include a material having an etch selectivity with respect to the first interlayer insulating film 120. For example, in a case where the first interlayer insulating film 120 includes silicon oxide, the second sacrificial pattern 216 may include silicon nitride.

In some example embodiments, a thickness TH21 of the fifth gate pattern 220e (e.g., the dummy word line) may be substantially equal to a thickness TH22 of the second sacrificial pattern 216. A description thereof will be given later with reference to FIGS. 30 to 34.

The second insertion insulating layer 122 may be formed on the fifth gate pattern 220e and the second sacrificial pattern 216. The second insertion insulating layer 122 of the cell region CELL may cover the fifth gate pattern 220e. In addition, the second insertion insulating layer 122 of the peripheral circuit region PERI may extend along at least a portion of the top surface of the second sacrificial pattern 216.

The second insertion insulating layer 122 may include, for example, at least one of silicon oxide, silicon nitride, and/or silicon oxynitride, but some other example embodiments of the present inventive concepts are not limited thereto.

In some example embodiments, a separation distance between the fifth gate pattern 220e and the first gate pattern 220a may be greater than a separation distance between the fifth gate pattern 220e and the second gate pattern 220b. For example, a thickness TH23 of the first interlayer insulating film 120 between the fifth gate pattern 220e and the first gate pattern 220a may be larger than a thickness TH24 of the second insertion insulating layer 122 between the fifth gate pattern 220e and the second gate pattern 220b.

The fifth gate pattern 220e may be disposed below the second gate pattern 220b disposed at the lowermost portion of the gate patterns 220b, 220c and 220d of the mold structure MS, thereby preventing (or reducing) a defect of the nonvolatile memory device that may occur below the second gate pattern 220b by the first interlayer insulating film 120.

In some example embodiments, the thickness TH24 of the second insertion insulating layer 122 on the fifth gate pattern 220e may be substantially the same as a thickness TH25 of the second insertion insulating layer 122 on the second sacrificial pattern 216. Thus, in some embodiments, the sum (TH21+TH24) of the thickness TH21 of the fifth gate pattern 220e and the thickness TH24 of the second insertion insulating layer 122 may be substantially the same as the sum (TH22+TH25) of the thickness TH22 of the second sacrificial pattern 216 and the thickness TH25 of the second insertion insulating layer 122. A description thereof will be given later with reference to FIGS. 30 to 34.

In some example embodiments, the second sacrificial pattern 216 may expose a portion of the top surface of the first interlayer insulating film 120. Further, in some example embodiments, the second insertion insulating layer 122 may expose a portion of the top surface of the second sacrificial pattern 216 and a portion of the top surface of the first interlayer insulating film 120. In this case, with respect to the top surface of the substrate 100, the height H11 of the bottom surface of the second gate pattern 220b (e.g., the lowermost word line WL0) may be substantially equal to the height H12 of the uppermost surface of the first interlayer insulating film 120 of the peripheral circuit region PERI. This can be attributed to, for example, a planarization process performed on the first interlayer insulating film 120, the second sacrificial pattern 216, and the second insertion insulating layer 122.

Figure 11:
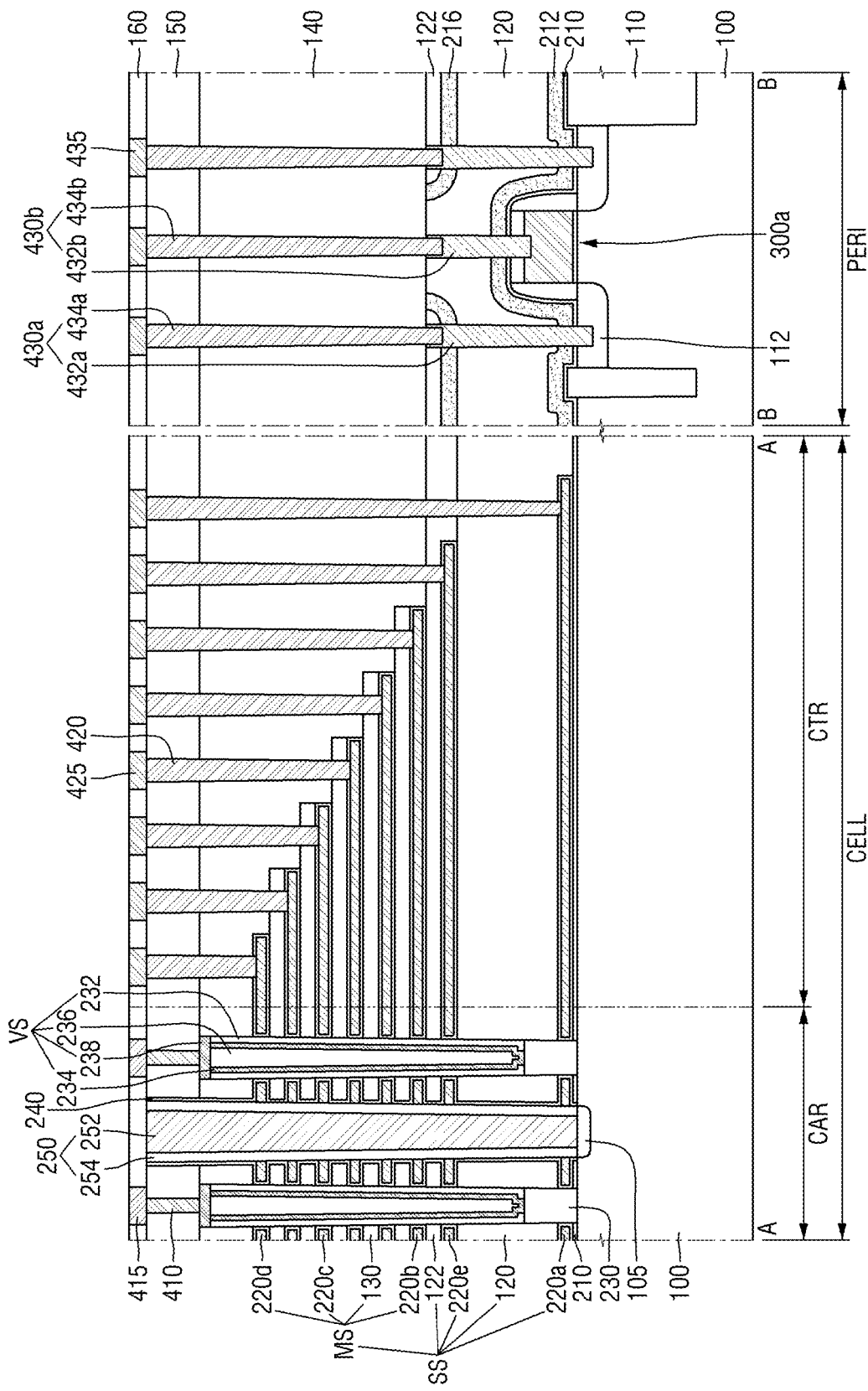
FIG. 11 is a cross-sectional view of a nonvolatile memory device according to some example embodiments of the present inventive concepts.

FIG. 11 is a cross-sectional view of a nonvolatile memory device according to some example embodiments of the present inventive concepts. For simplicity of description, a description overlapping with the description with reference to FIGS. 1 to 7E and 10 will be briefly given or omitted.

Referring to FIG. 11, in a nonvolatile memory device according to some example embodiments, a portion of the lower contacts 432a and 432b passes through (or penetrates) the second sacrificial pattern 216 and the second insertion insulating layer 122. For example, the first lower contact 432a may sequentially pass through the second insertion insulating layer 122, the second sacrificial pattern 216, the first interlayer insulating film 120, and the first sacrificial pattern 212, and may be connected to a peripheral circuit element 300a.

In some example embodiments, a portion of the lower contacts 432a and 432b may not pass through (or penetrate) the second sacrificial pattern 216 and/or the second insertion insulating layer 122. For example, the second lower contact 432b may sequentially pass through only the first interlayer insulating film 120 and the first sacrificial pattern 212, and may be connected to the peripheral circuit element 300a.

This can be attributed to, for example, the size of the peripheral circuit element 300a provided on the peripheral circuit region PERI and/or the characteristics of a deposition process for forming the first interlayer insulating film 120, the second sacrificial pattern 216, and the second insertion insulating layer 122.

Figure 12:
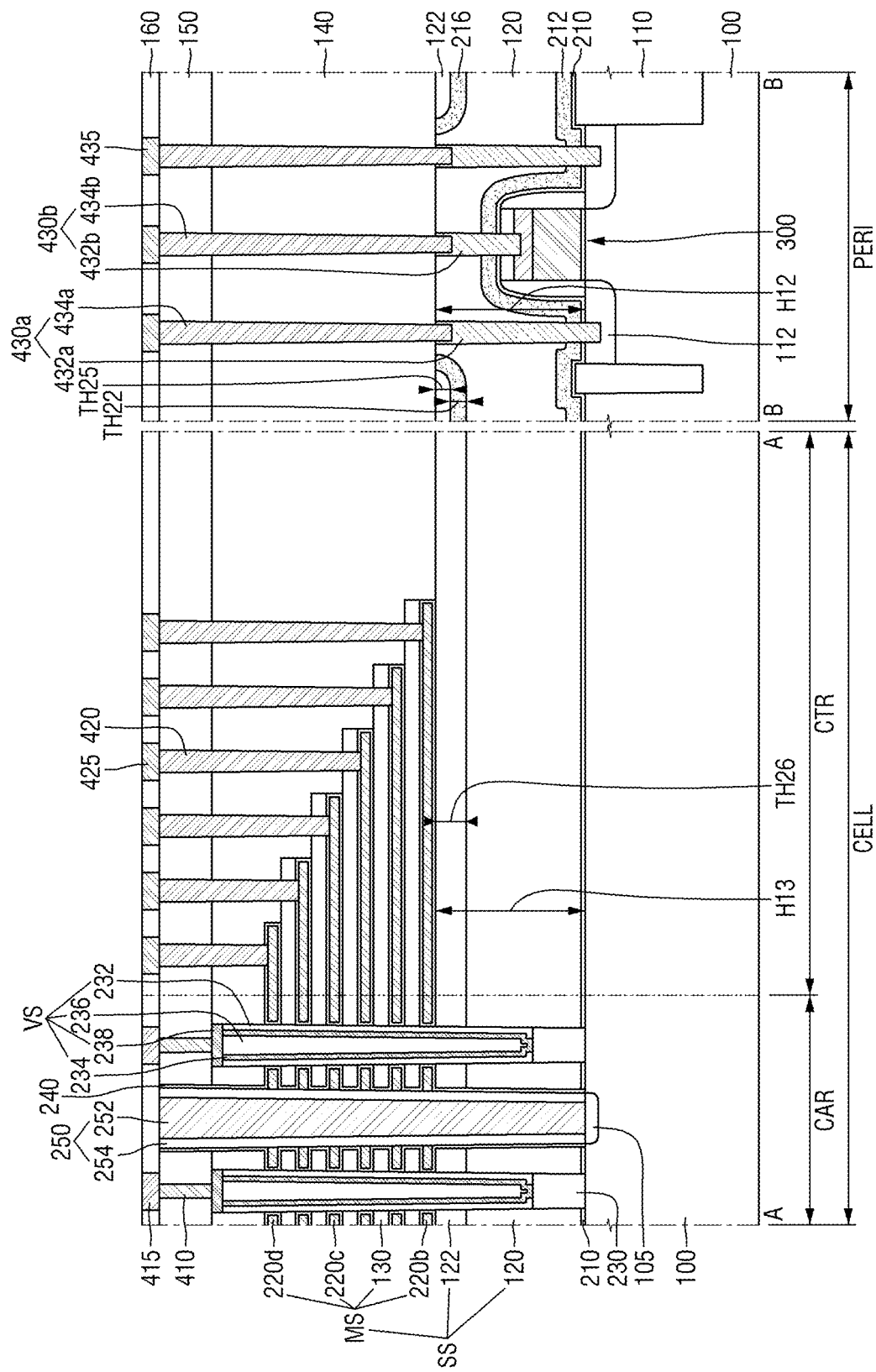
FIG. 12 is a cross-sectional view of a nonvolatile memory device according to some example embodiments of the present inventive concepts.

FIG. 12 is a cross-sectional view of a nonvolatile memory device according to some example embodiments of the present inventive concepts. For reference, FIG. 12 represents cross-sectional views taken along lines A-A and B-B of FIG. 4. For simplicity of description, a description overlapping with the description with reference to FIGS. 1 to 10 will be briefly given or omitted.

Referring to FIG. 12, in a nonvolatile memory device according to some example embodiments, all the gate patterns 220b, 220c and 220d are formed on the second insertion insulating layer 122.

For example, a gate pattern may not be formed in the first interlayer insulating film 120 and the second insertion insulating layer 122. For example, the first gate pattern 220a formed in the first interlayer insulating film 120 of FIG. 10 and the fifth gate pattern 220e formed in the second insertion insulating layer 122 of FIG. 10 may be omitted. Thus, in some example embodiments, the height of the upper surfaces of the lower contacts 432a and 432b may be lower than or equal to the height of the bottom surface of the second gate pattern 220b disposed at the lowermost portion of all the gate patterns 220b, 220c and 220d.

In some example embodiments, with respect to the top surface of the substrate 100, a height H13 of the top surface of the second insertion insulating layer 122 of the cell region CELL may be substantially equal to a height H12 of the uppermost surface of the first interlayer insulating film 120 of the peripheral circuit region PERI.

In some example embodiments, a thickness TH26 of the second insertion insulating layer 122 of the cell region CELL may be substantially the same as the sum (TH22+TH25) of the thickness TH22 of the second sacrificial pattern 216 and the thickness TH25 of the second insertion insulating layer 122 of the peripheral circuit region PERI.

Figure 13:
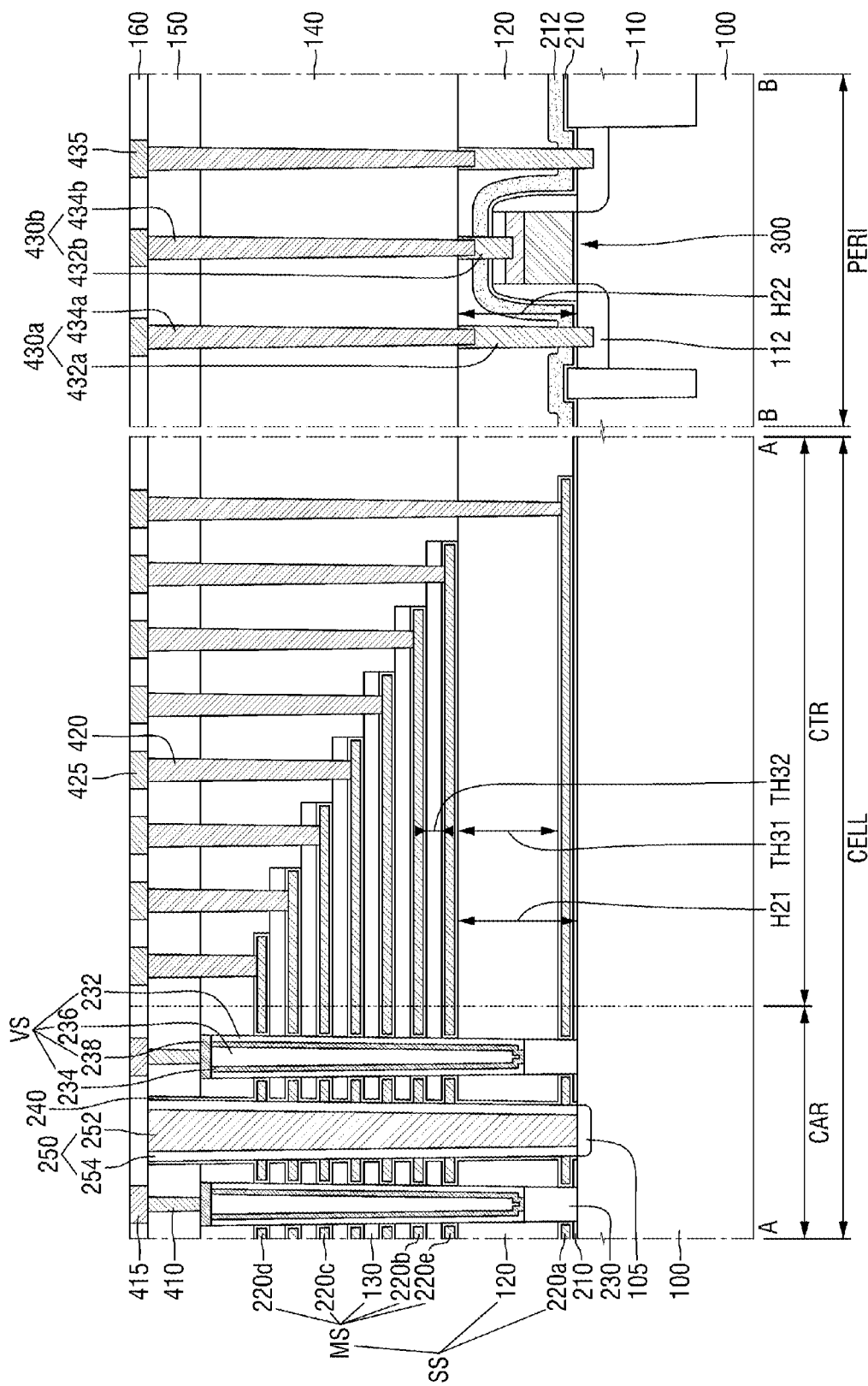
FIG. 13 is a cross-sectional view of a nonvolatile memory device according to some example embodiments of the present inventive concepts.

FIG. 13 is a cross-sectional view of a nonvolatile memory device according to some example embodiments of the present inventive concepts. For simplicity of description, a description overlapping with the description with reference to FIGS. 1 to 7E and 10 will be briefly given or omitted.

Referring to FIG. 13, in a nonvolatile memory device according to some example embodiments, with reference to the top surface of the substrate 100, a height H21 of the bottom surface of the fifth gate pattern 220e (e.g., the dummy word line) may be substantially equal to a height H22 of the top surface of the first interlayer insulating film 120 of the peripheral circuit region PERI.

In some example embodiments, the fifth gate pattern 220e may be the lowermost gate pattern of the gate patterns of the mold structure MS. For example, the fifth gate pattern 220e may be separated from the second gate pattern 220b by the lowermost insulation pattern of the insulation patterns 130.

In some example embodiments, a separation distance between the fifth gate pattern 220e and the first gate pattern 220a may be greater than a separation distance between the fifth gate pattern 220e and the second gate pattern 220b. For example, a thickness TH31 of the first interlayer insulating film 120 between the fifth gate pattern 220e and the first gate pattern 220a may be larger than a thickness TH32 of the insulation pattern 130 between the fifth gate pattern 220e and the second gate pattern 220b.

Hereinafter, a method for fabricating a nonvolatile memory device according to some example embodiments of the present inventive concepts will be described with reference to FIGS. 1 to 34.

FIGS. 14 to 29 are diagrams illustrating the intermediate steps of a method for fabricating a nonvolatile memory device according to some example embodiments of the present inventive concepts. For simplicity of description, a description overlapping with the description with reference to FIGS. 1 to 13 will be briefly given or omitted.

Figure 14:
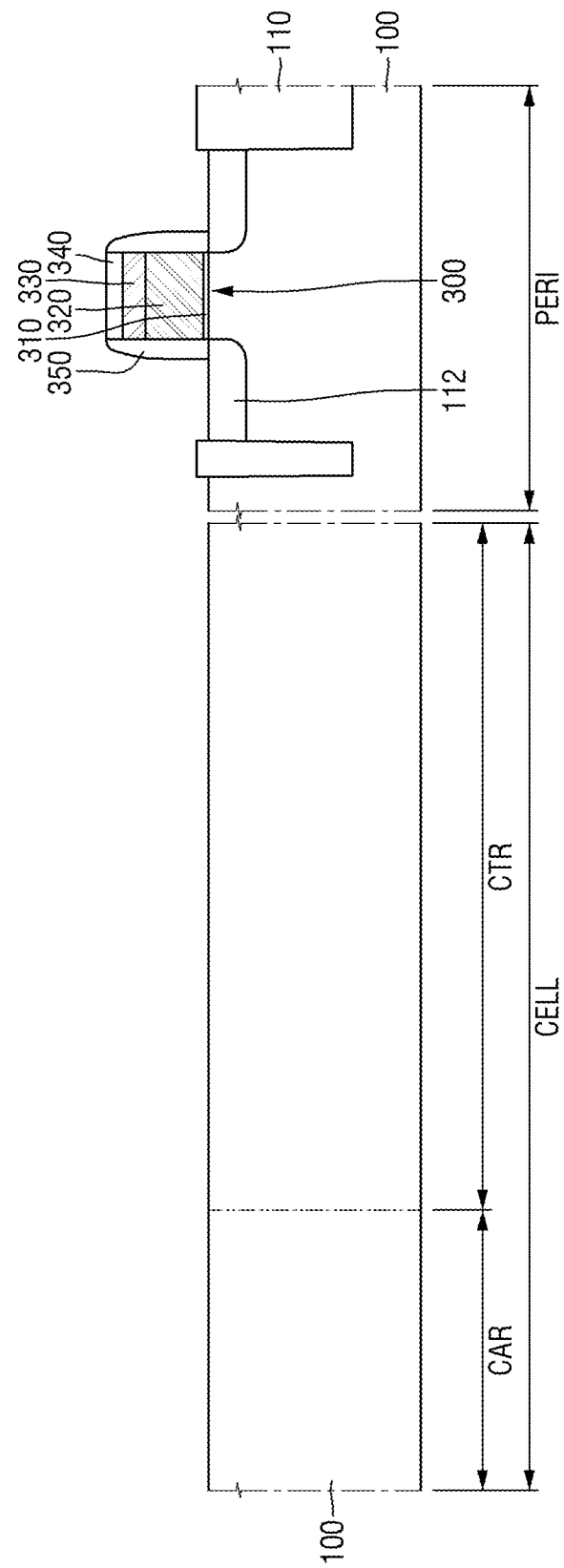
FIGS. 14 to 29 are diagrams illustrating the intermediate steps of a method for fabricating a nonvolatile memory device according to some example embodiments of the present inventive concepts.

Referring to FIG. 14, a substrate 100 including a cell region CELL and a peripheral circuit region PERI is provided.

A peripheral circuit element 300 may be formed on the substrate 100 of the peripheral circuit region PERI. The peripheral circuit element 300 may be formed on an active region of the substrate 100 defined by an element isolation layer 110 in the peripheral circuit region PERI.

In some example embodiments, the peripheral circuit element 300 may be a high voltage transistor or a low voltage transistor. For example, the peripheral circuit element 300 may include peripheral circuit gate patterns 320 and 330, a second gate insulating layer 310, a capping pattern 340, gate spacers 350, and a second impurity region 112.

Figure 15:
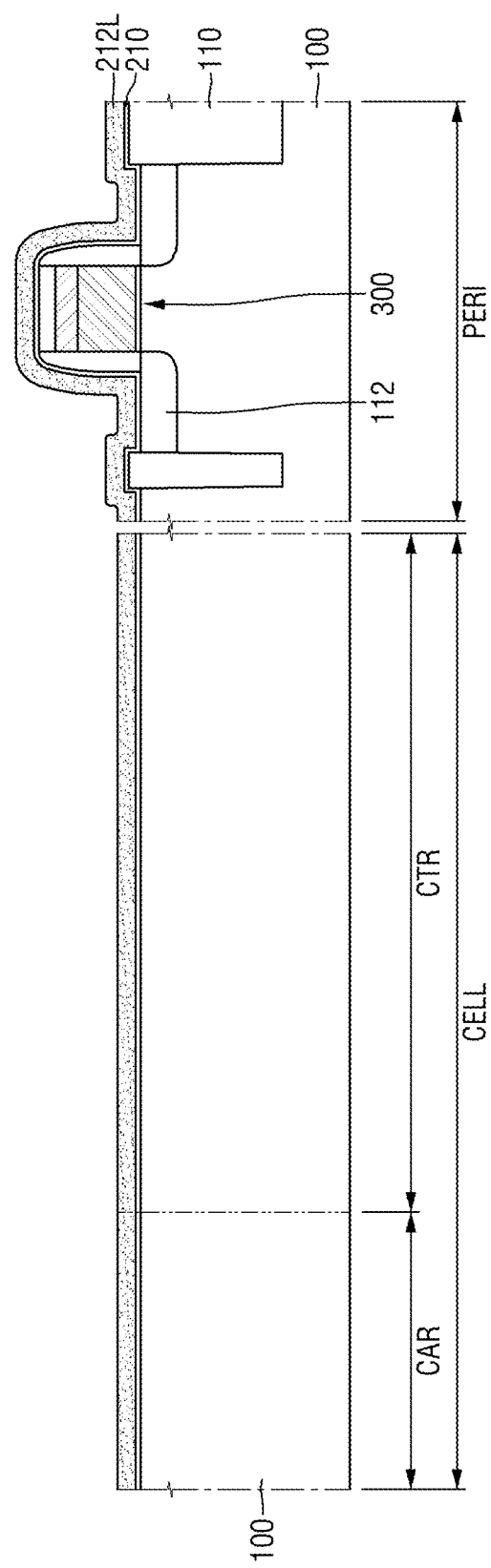

Referring to FIG. 15, a first sacrificial layer 212L is formed on the substrate 100 and the peripheral circuit element 300.

The first sacrificial layer 212L may be formed conformally along the substrate 100 of the cell region CELL, the substrate 100 of the peripheral circuit region PERI, and the peripheral circuit element 300.

The first sacrificial layer 212L may include a material having an etch selectivity with respect to a first interlayer insulating film 120, which will be described later. For example, in a case where the first interlayer insulating film 120 includes silicon oxide, a first sacrificial pattern 212 may include silicon nitride.

In some example embodiments, a buffer insulating layer 210 may be formed on the substrate 100 and the peripheral circuit element 300 before forming the first sacrificial layer 212L. The buffer insulating layer 210 may include, for example, silicon oxide, but some other example embodiments of the present inventive concepts are not limited thereto.

Figure 16:
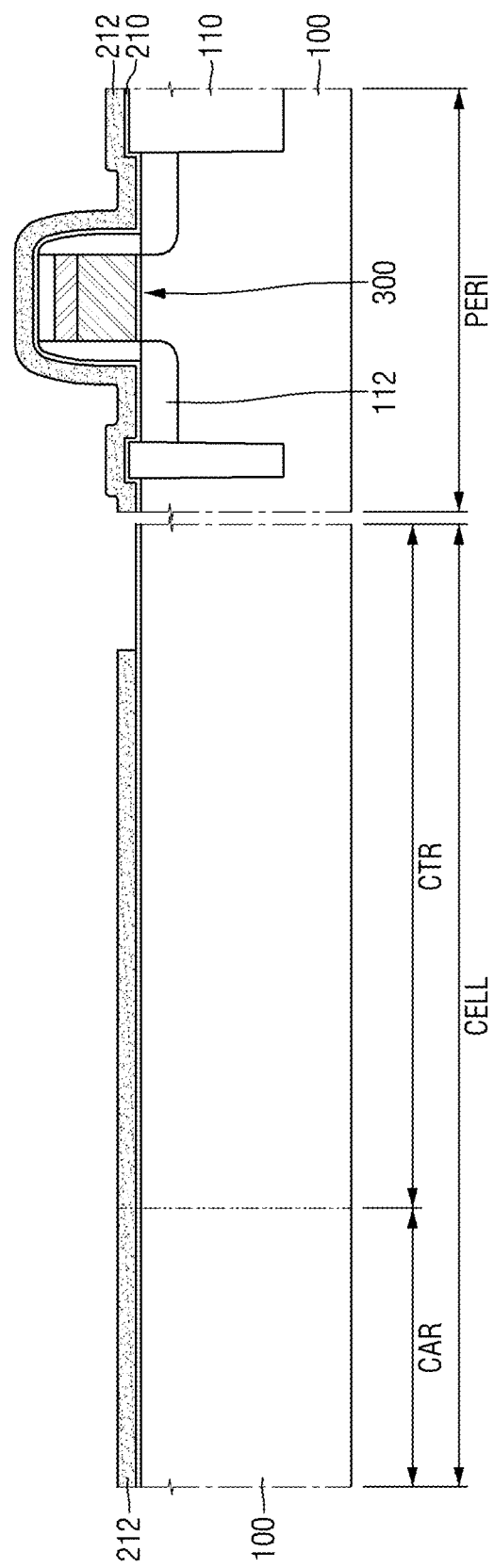

Referring to FIG. 16, the first sacrificial layer 212L is patterned to form the first sacrificial pattern 212.

For example, a portion of the first sacrificial layer 212L of the cell region CELL adjacent to the peripheral circuit region PERI may be removed. In some example embodiments, the first sacrificial layer 212L on the peripheral circuit region PERI may not be removed. Accordingly, the first sacrificial pattern 212 may be formed to extend along a portion of the substrate 100 of the cell region CELL, the substrate 100 of the peripheral circuit region PERI, and the peripheral circuit element 300.

Figure 17:
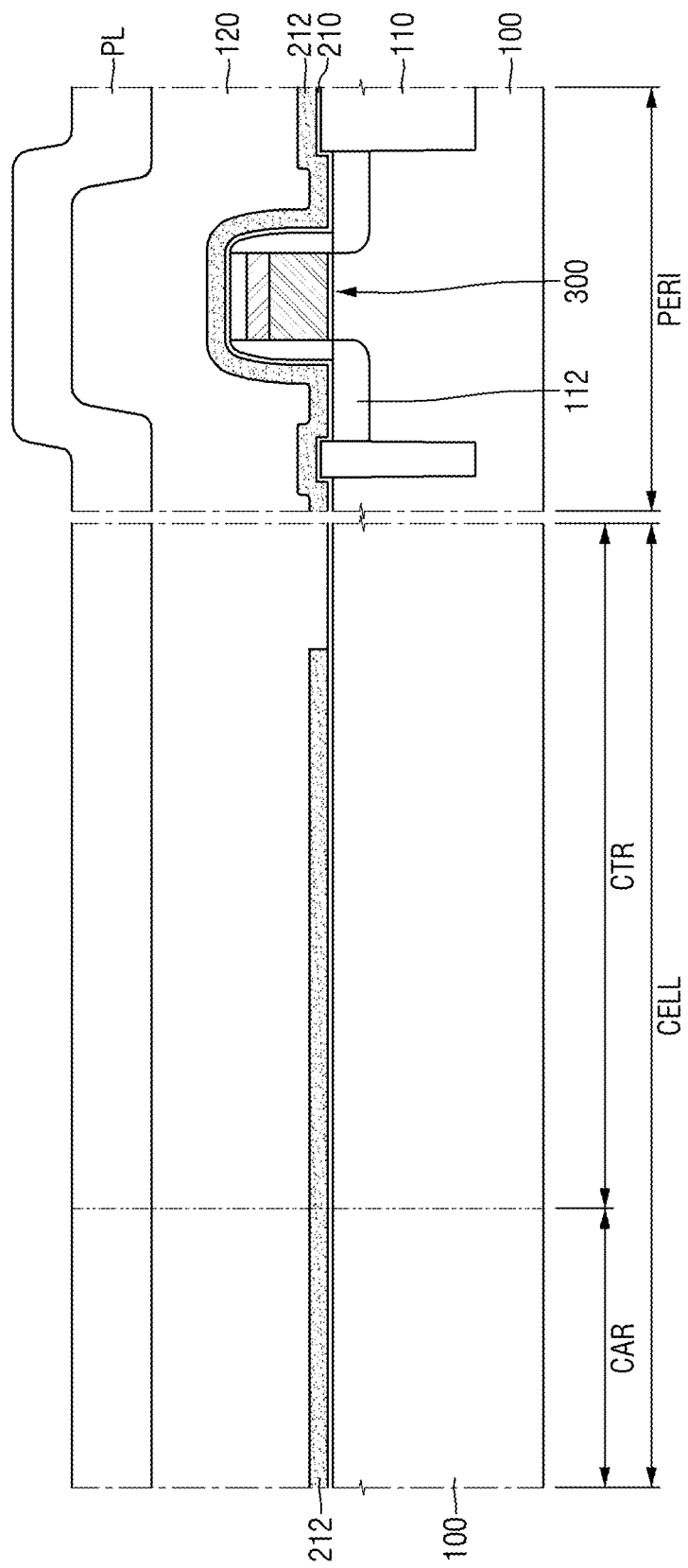

Referring to FIG. 17, the first interlayer insulating film 120 and a planarization film PL are sequentially formed on the first sacrificial pattern 212.

The planarization film PL may include a material having an etch selectivity with respect to the first interlayer insulating film 120. For example, the planarization film PL may include, but is not limited to, silicon nitride.

Figure 18:
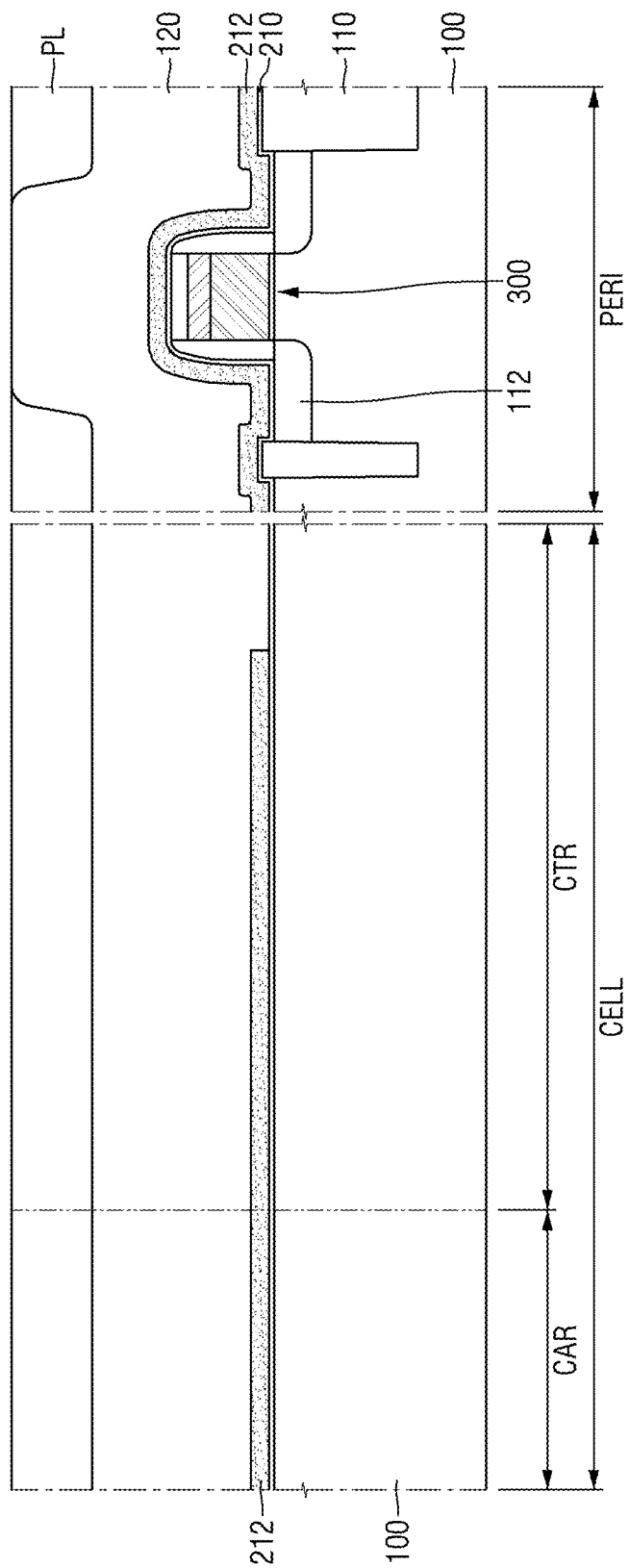

Referring to FIG. 18, a first planarization process is performed on the planarization film PL.

The first planarization process is performed to remove at least a portion of the planarization film PL until the top surface of the first interlayer insulating film 120 is exposed, but some other example embodiments of the present inventive concepts are not limited thereto. For example, the first planarization process may also remove a portion of the first interlayer insulating film 120.

The first planarization process may include, for example, chemical mechanical polishing (CMP), but some other example embodiments of the present inventive concepts are not limited thereto.

Figure 19:
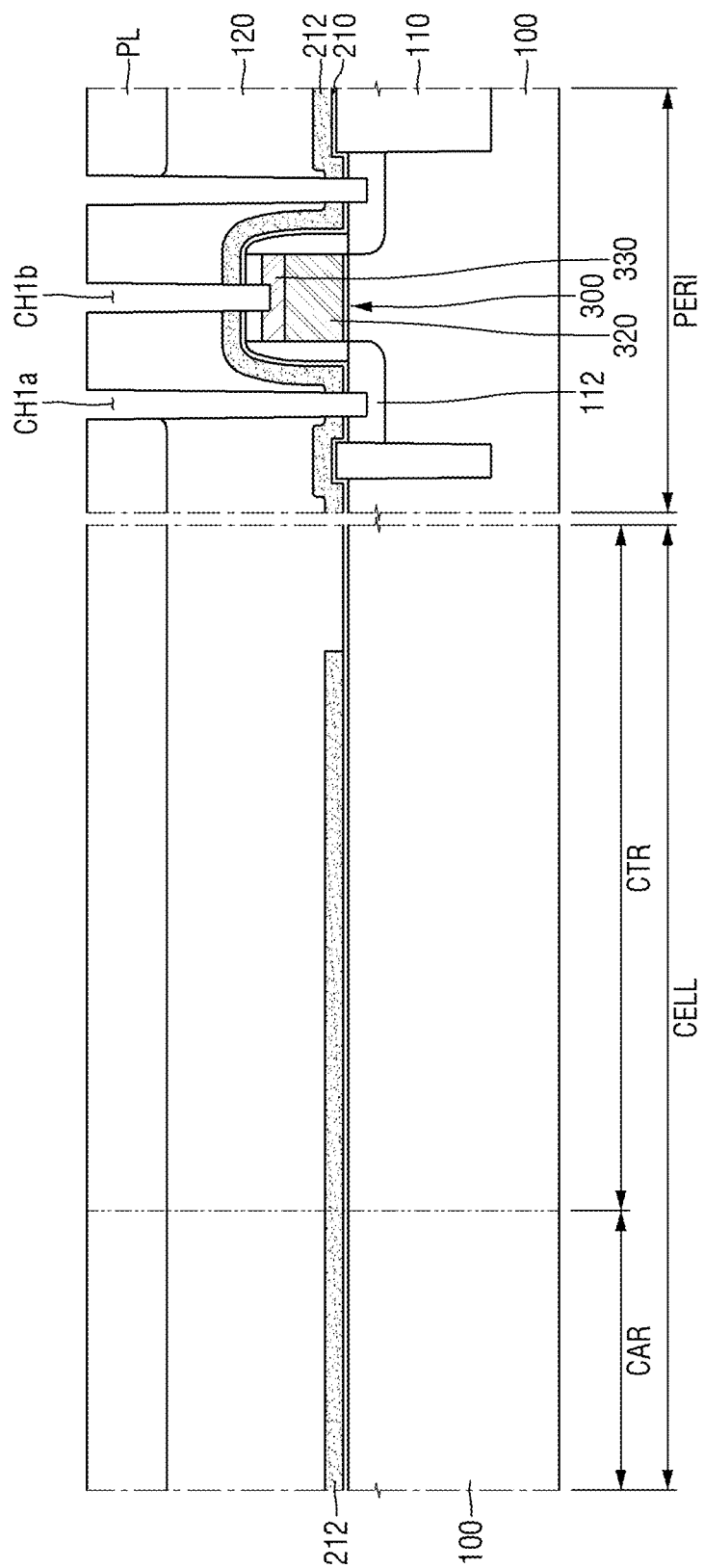

Referring to FIG. 19, first contact holes CH1a and CH1b are formed to expose at least a portion of the peripheral circuit element 300 through the first interlayer insulating film 120, the first sacrificial pattern 212, and the buffer insulating layer 210.

For example, the first contact hole CH1a exposing at least a portion of a second impurity region 112 of the peripheral circuit element 300, and the first contact hole CH1b exposing at least a portion of the peripheral circuit gate patterns 320 and 330 of the peripheral circuit element 300 may be formed.

Figure 20:
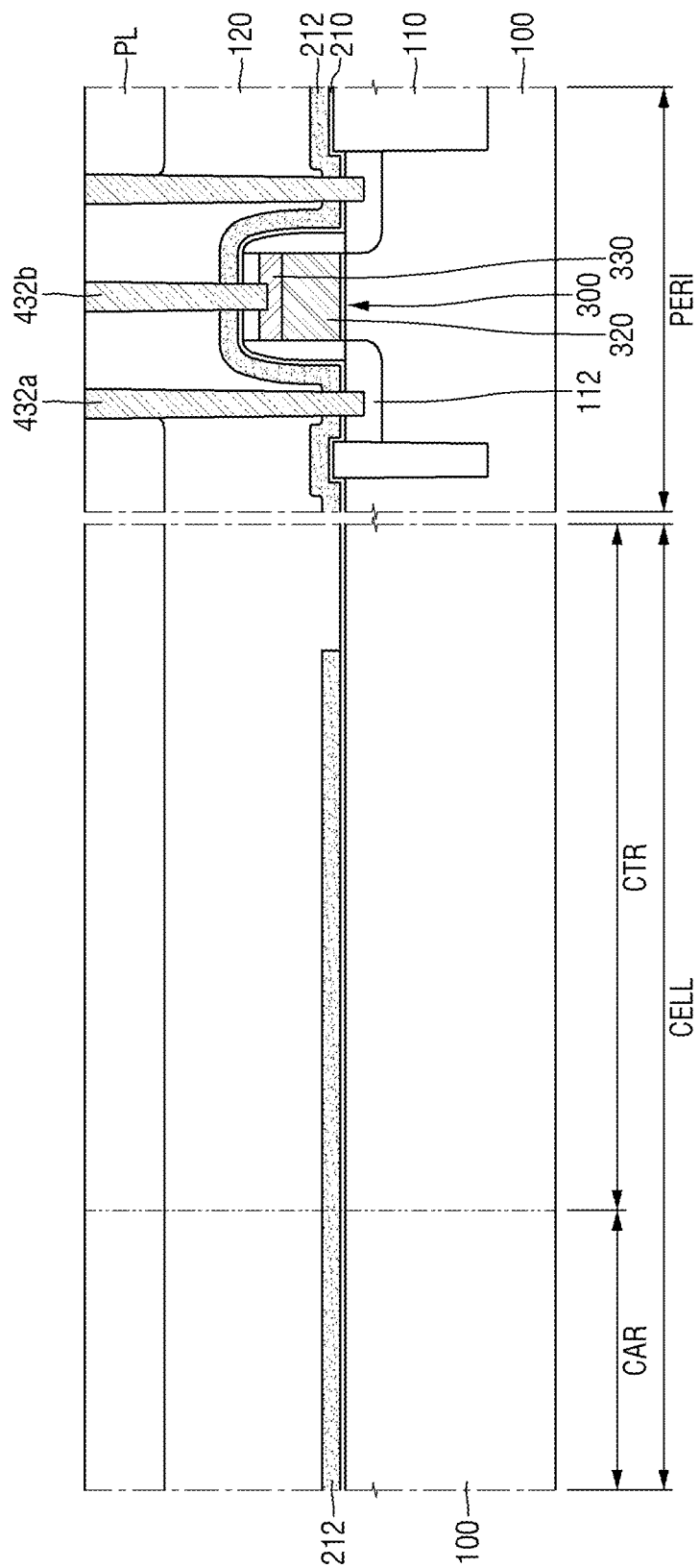

Referring to FIG. 20, lower contacts 432a and 432b are formed in the first contact holes CH1a and CH1b.

For example, a first lower contact 432a filling the first contact hole CH1a and a second lower contact 432b filling the first contact hole CH1b may be formed. The first lower contact 432a connected to the second impurity region 112 and the second lower contact 432b connected to the peripheral circuit gate patterns 320 and 330 may be formed.

Figure 21:
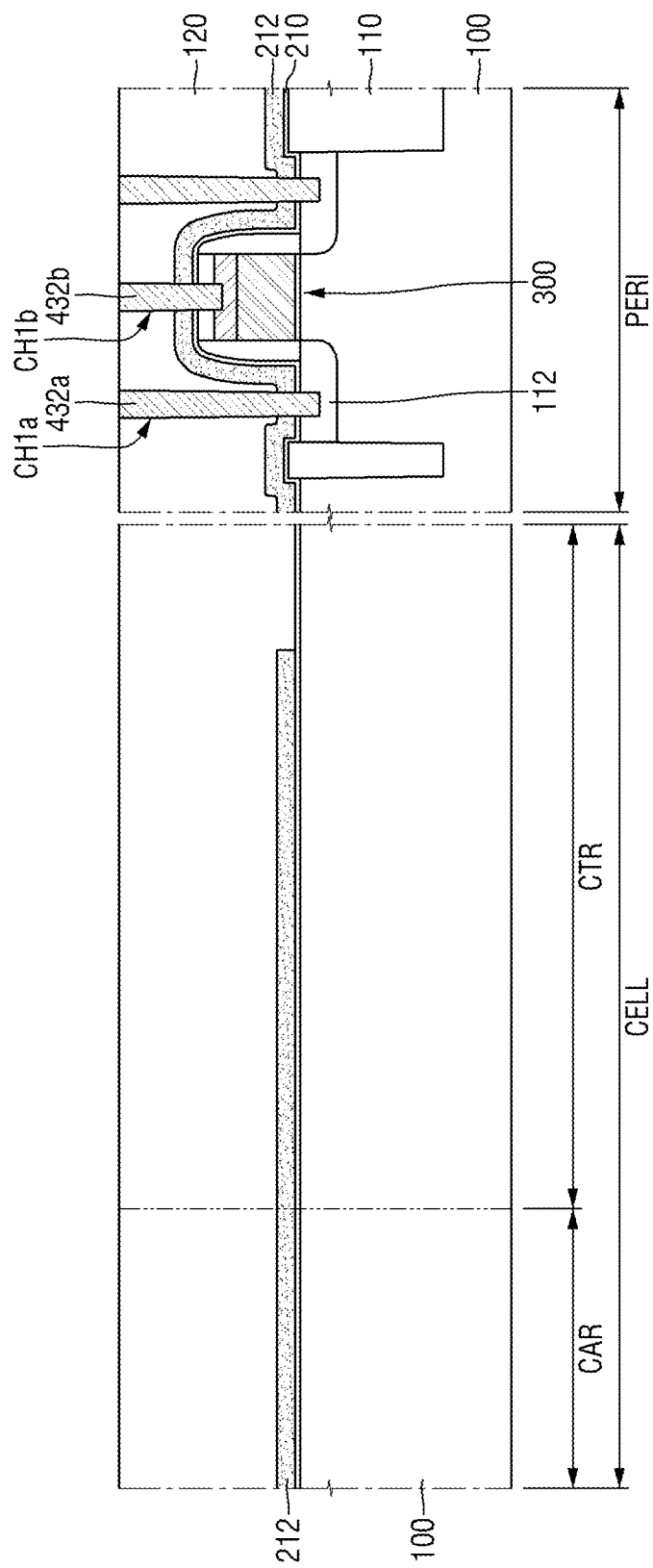

Referring to FIG. 21, the planarization film PL is removed.

For example, a second planarization process may be performed on the planarization film PL. The second planarization process may be performed until, for example, the planarization film PL is removed (e.g., any portion of the planarization film PL remaining after the first planarization process). Thus, in some example embodiments, the top surface of the first interlayer insulating film 120 may be exposed as a result of the second planarization process.

Figure 22:
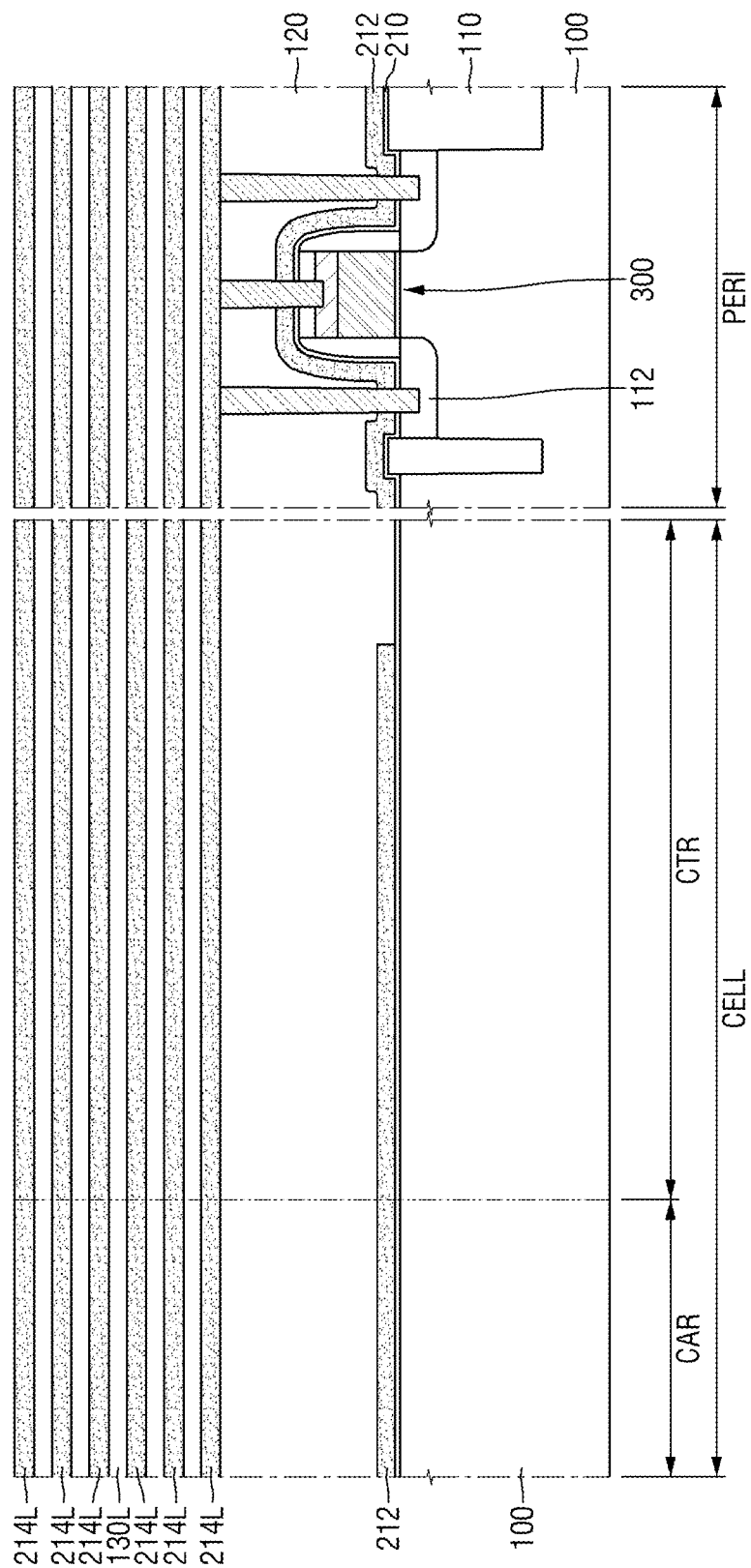

Referring to FIG. 22, a plurality of second sacrificial films 214L and a plurality of insulating films 130L are formed on the first interlayer insulating film 120.

The second sacrificial films 214L and the insulating films 130L may be stacked alternately and repeatedly.

Figure 23:
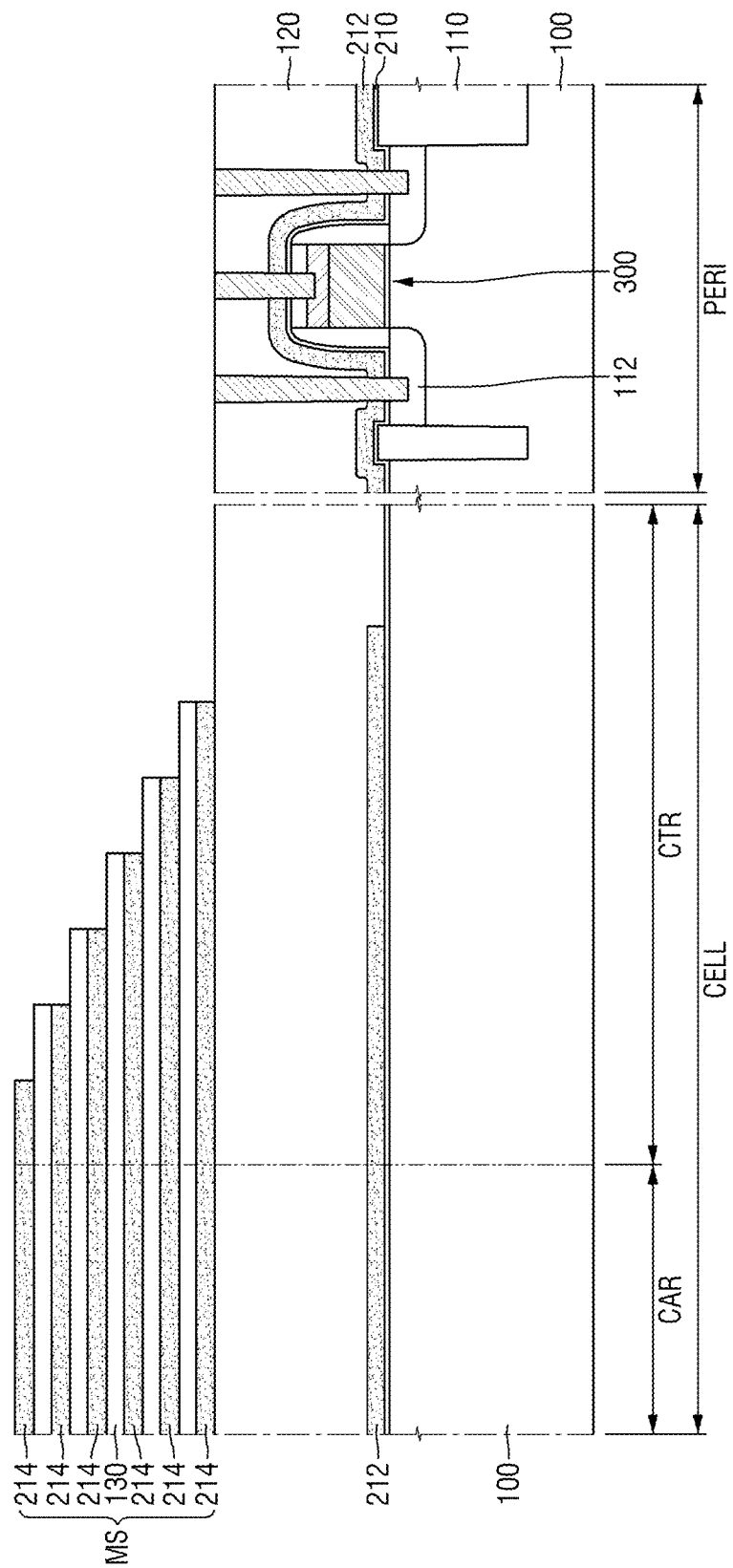

Referring to FIG. 23, a mold structure MS including a plurality of third sacrificial patterns 214 and a plurality of insulation patterns 130 is formed on the first interlayer insulating film 120 of the cell region CELL.

The third sacrificial patterns 214 and the insulation patterns 130 may be stacked alternately and repeatedly. The mold structure MS may be patterned in a stepwise structure on a contact region CTR. For example, the mold structure MS may have an end portion of the stepwise structure in the contact region CTR. Patterning the mold structure MS may be performed, for example, by an etching process which is repeatedly performed to reduce the width of a mask pattern (not shown) formed on the plurality of insulation patterns 130 and the plurality of third sacrificial patterns 214.

Figure 24:
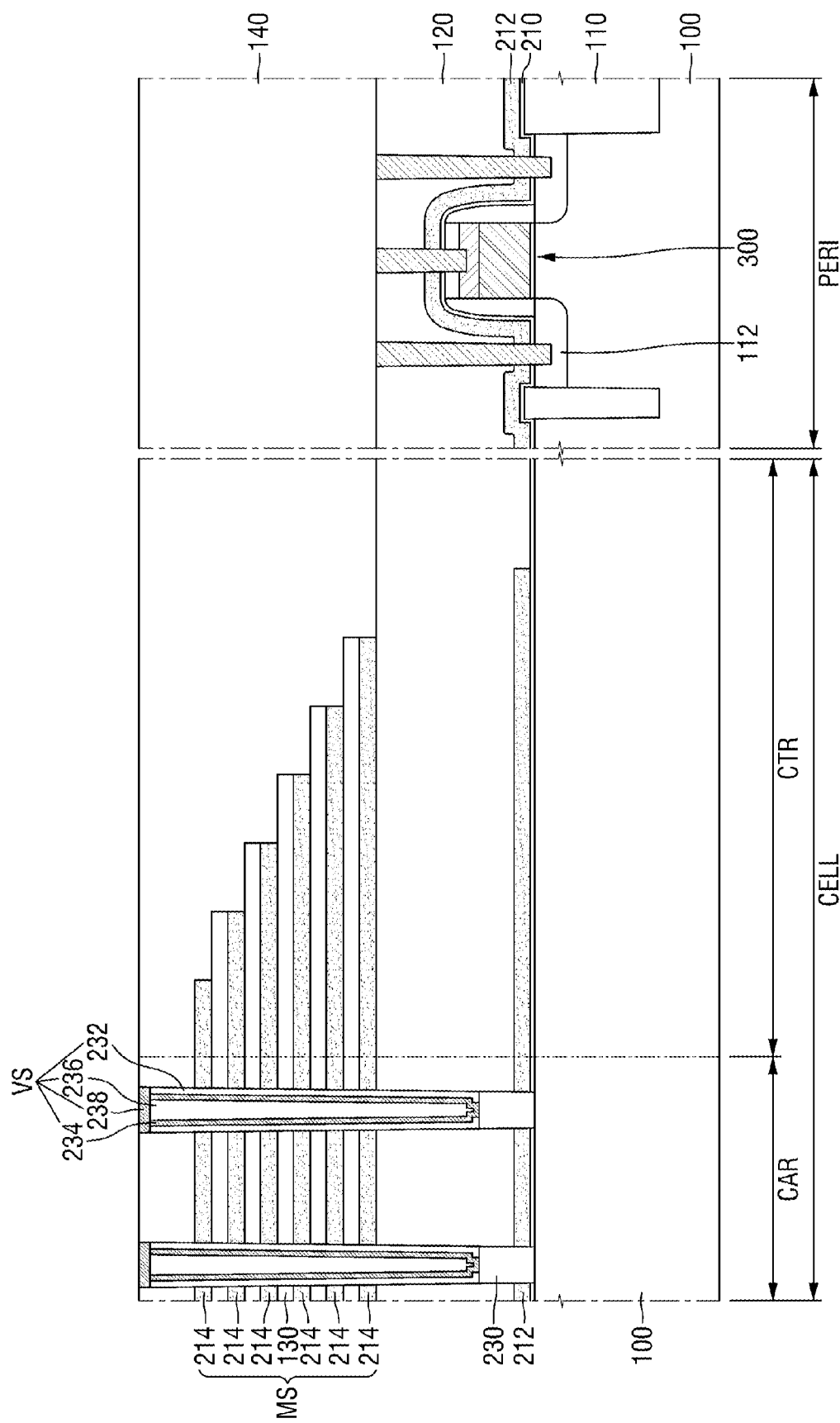

Referring to FIG. 24, a vertical channel structure VS is formed, which is connected to the substrate 100 through the mold structure MS.

For example, a second interlayer insulating film 140 covering the mold structure MS may be formed on the first interlayer insulating film 120. Then, the vertical channel structure VS may be formed to sequentially pass through (or penetrate) the second interlayer insulating film 140, the mold structure MS, the first interlayer insulating film 120, the first sacrificial pattern 212, and the buffer insulating layer 210, and may be connected to the substrate 100.

In some example embodiments, the vertical channel structure VS may include a first semiconductor pattern 234, a gap fill pattern 236, a second semiconductor pattern 230, a charge storage structure 232 and a channel pad 238.

Figure 25:
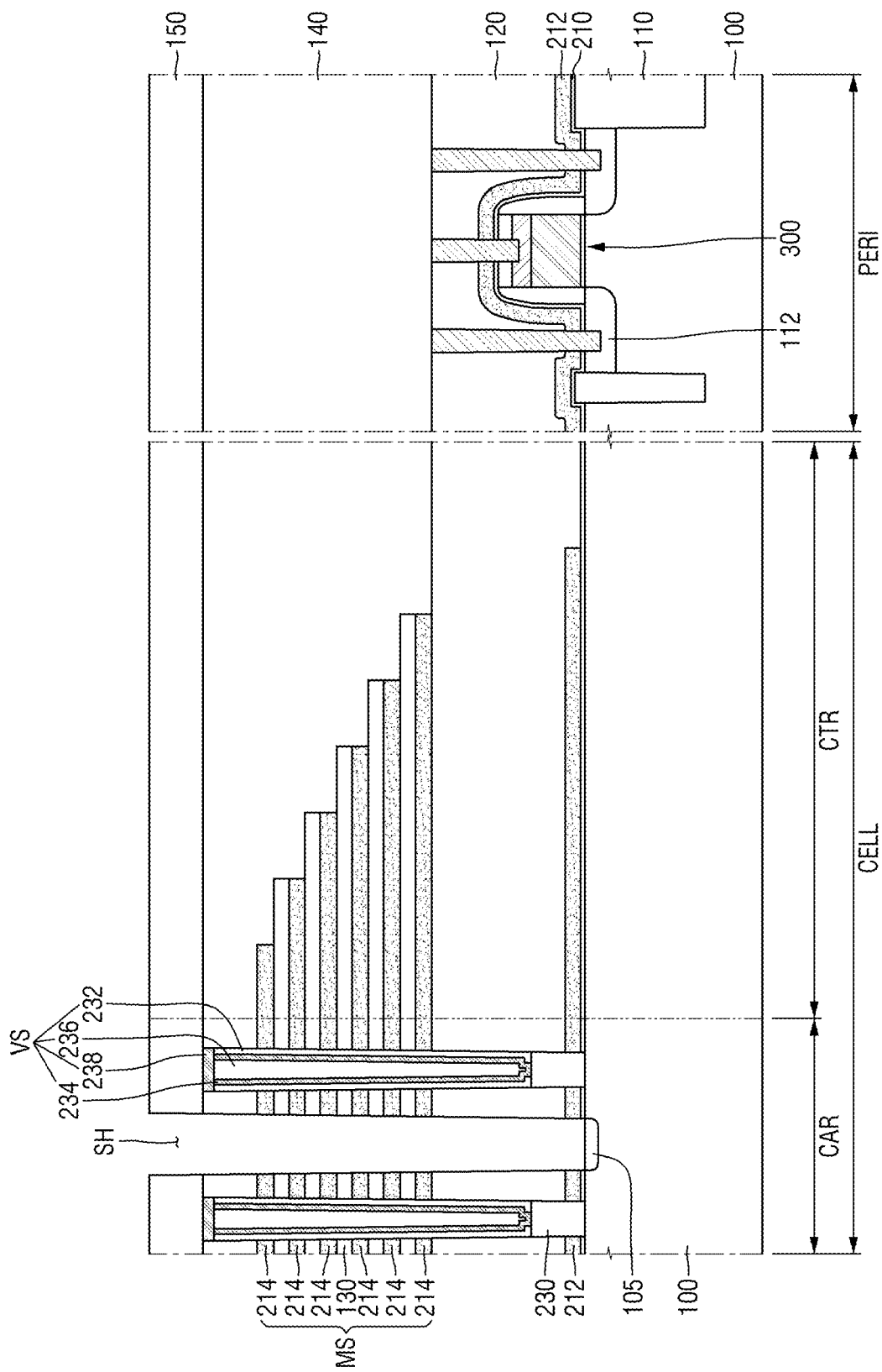

Referring to FIG. 25, a common source contact hole SH is formed to be separated from the vertical channel structure VS and to expose a portion of the substrate 100 of the cell region CELL.

For example, a third interlayer insulating film 150 may be formed on the second interlayer insulating film 140. Subsequently, the common source contact hole SH may be formed to sequentially pass through the third interlayer insulating film 150, the second interlayer insulating film 140, the mold structure MS, the first interlayer insulating film 120, the first sacrificial pattern 212, and the buffer insulating layer 210, and to expose a portion of the substrate 100.

In some example embodiments, a first impurity region 105 may be formed in the substrate 100 exposed by the common source contact hole SH.

Figure 26:
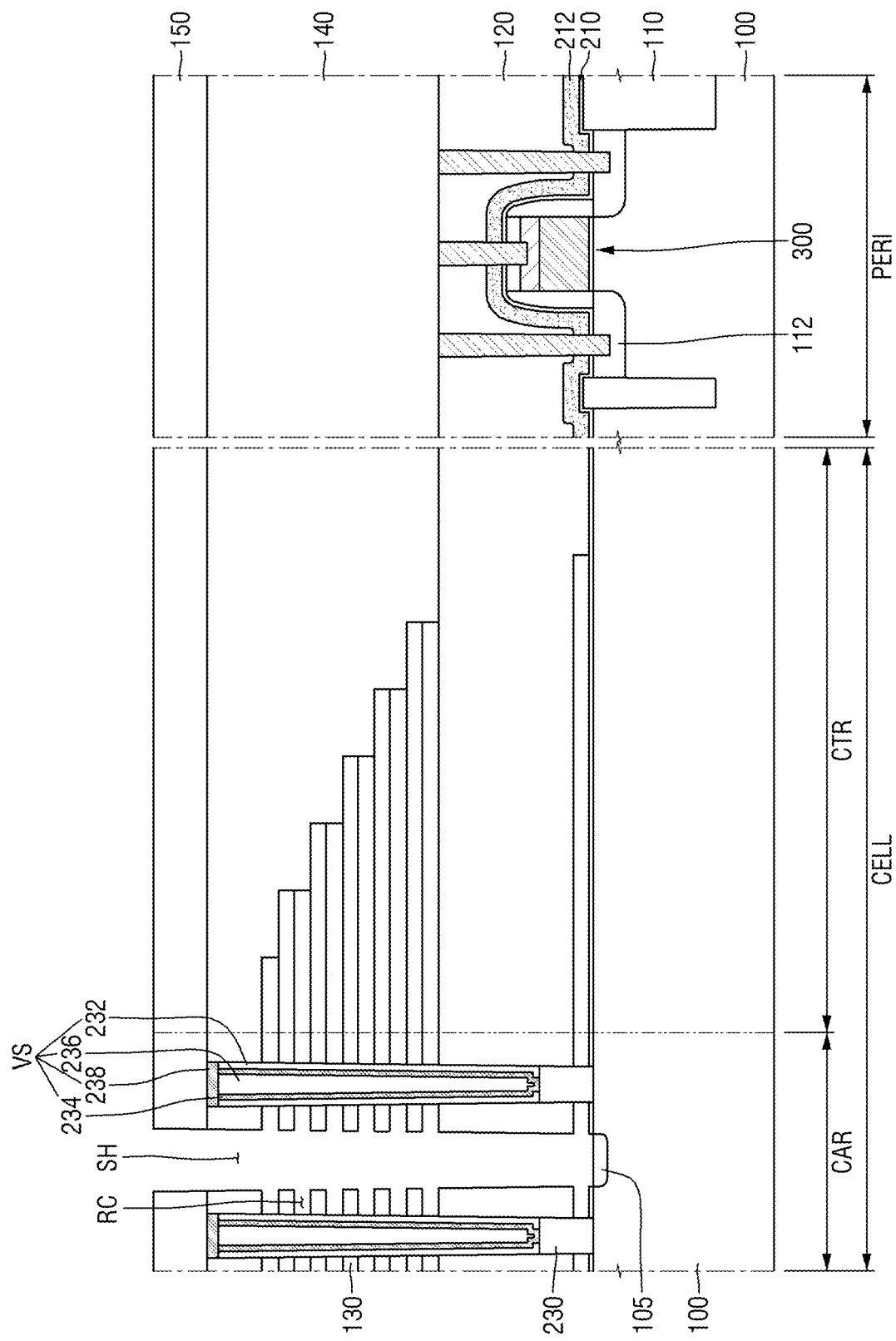

Referring to FIG. 26, the third sacrificial patterns 214 exposed by the common source contact hole SH are removed.

Removing the third sacrificial patterns 214 may be performed, for example, by an anisotropic etching process. Accordingly, a recess RC may be formed in a region where the third sacrificial patterns 214 are removed.

Figure 27:
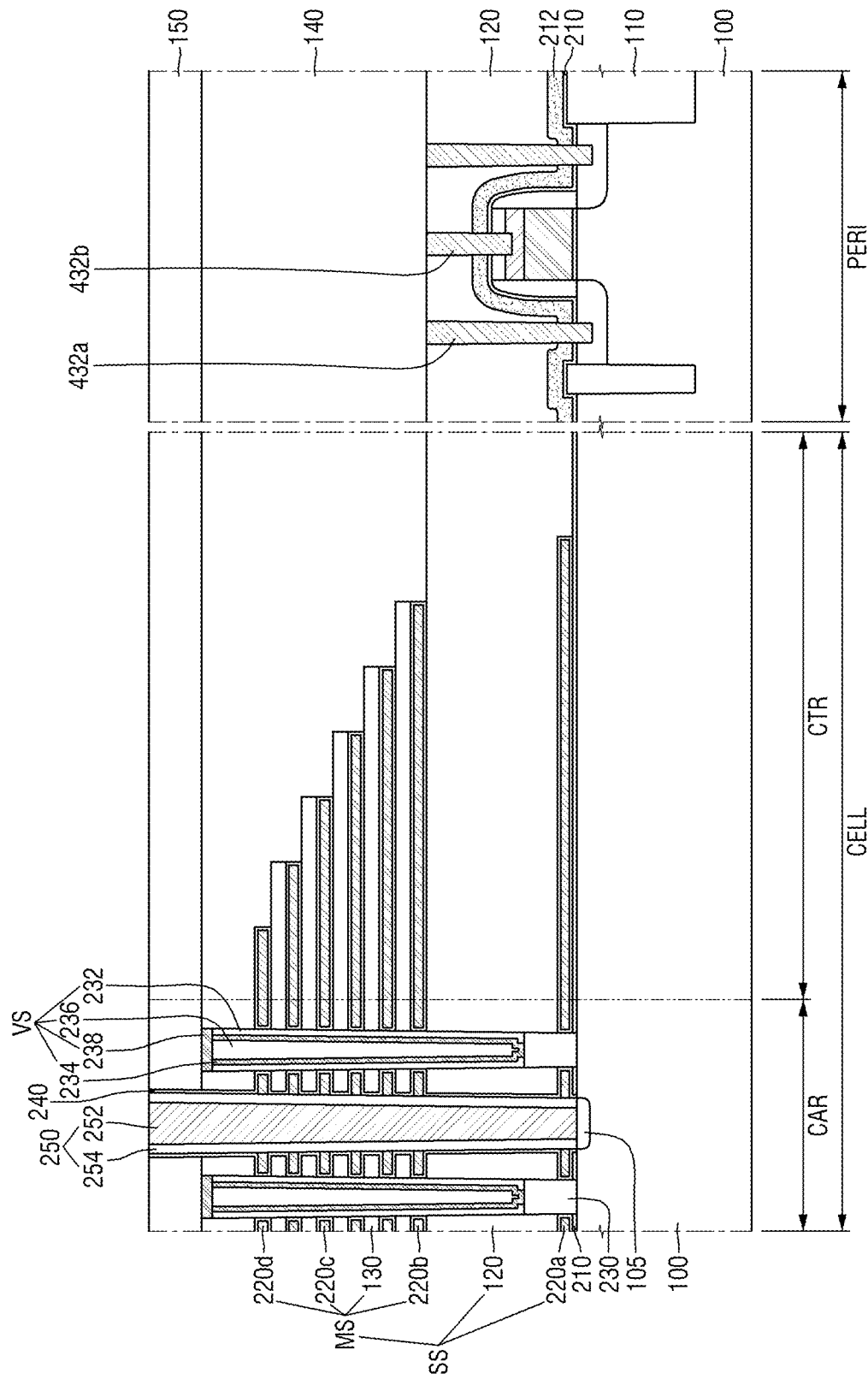

Referring to FIG. 27, a plurality of gate patterns 220a, 220b, 220c and 220d and a common source contact structure 250 are formed.

For example, the plurality of gate patterns 220a, 220b, 220c and 220d filling the recess RC may be formed. In some example embodiments, before forming the plurality of gate patterns 220a, 220b, 220c and 220d, a first gate insulating layer 240 may be formed to extend along the inner surface of the recess RC and the sidewalls of the insulation patterns 130.

Then, a common source contact structure 250 filling the common source contact hole SH may be formed. In some example embodiments, the common source contact structure 250 may include a common source plug pattern 252 and common source spacers 254.

Figure 28:
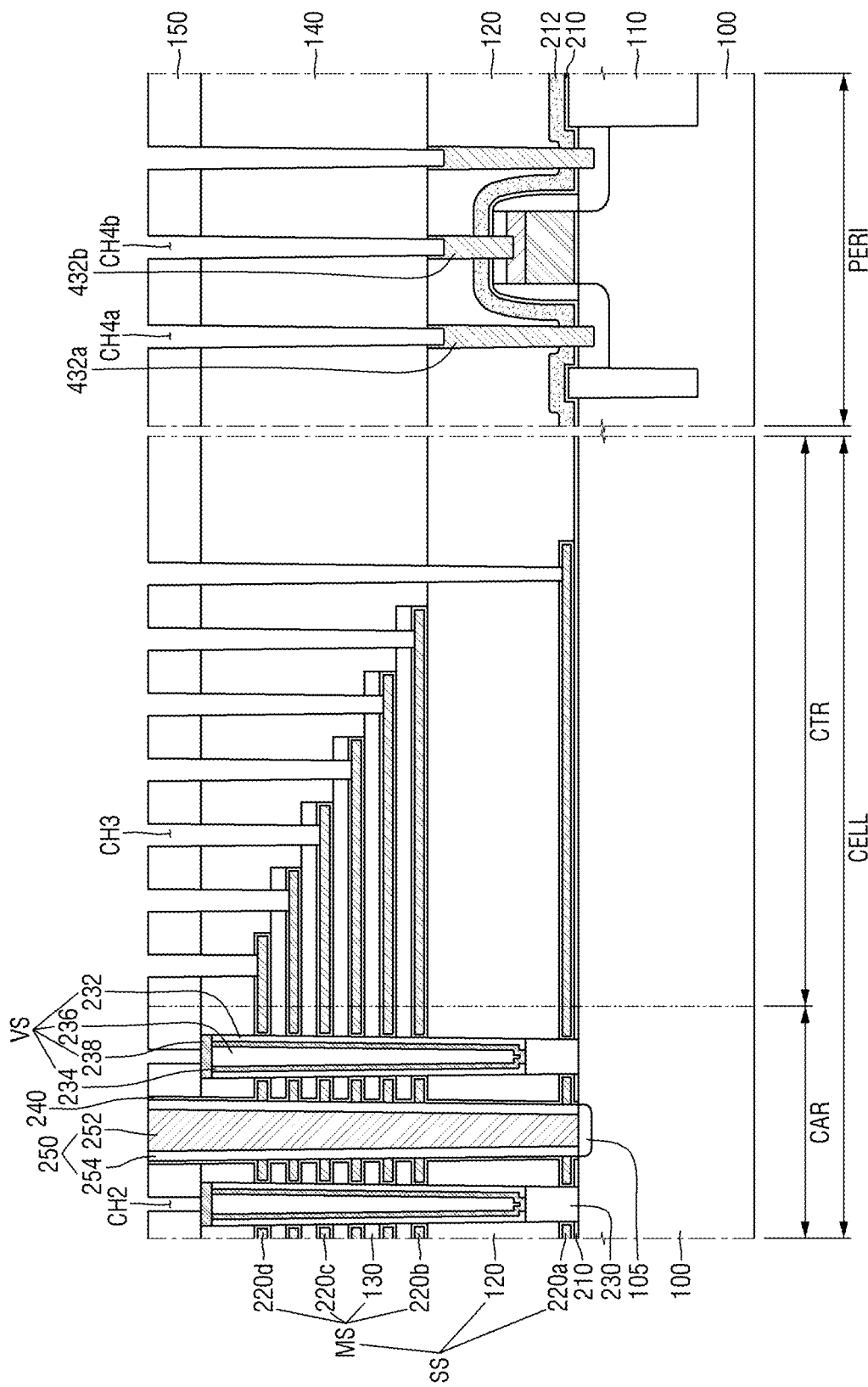

Referring to FIG. 28, second contact holes CH2, third contact holes CH3, and fourth contact holes CH4a and CH4b are formed.

The second contact holes CH2 may be formed to expose the top surface of the channel pad 238. The third contact holes CH3 may be formed to expose end portions of the gate patterns 220a, 220b, 220c and 220d. The fourth contact holes CH4a and CH4b may be formed to expose the lower contacts 432a and 432b, respectively.

The second contact holes CH2, the third contact holes CH3 and the fourth contact holes CH4a and CH4b may be formed simultaneously or not simultaneously (e.g., sequentially).

Figure 29:
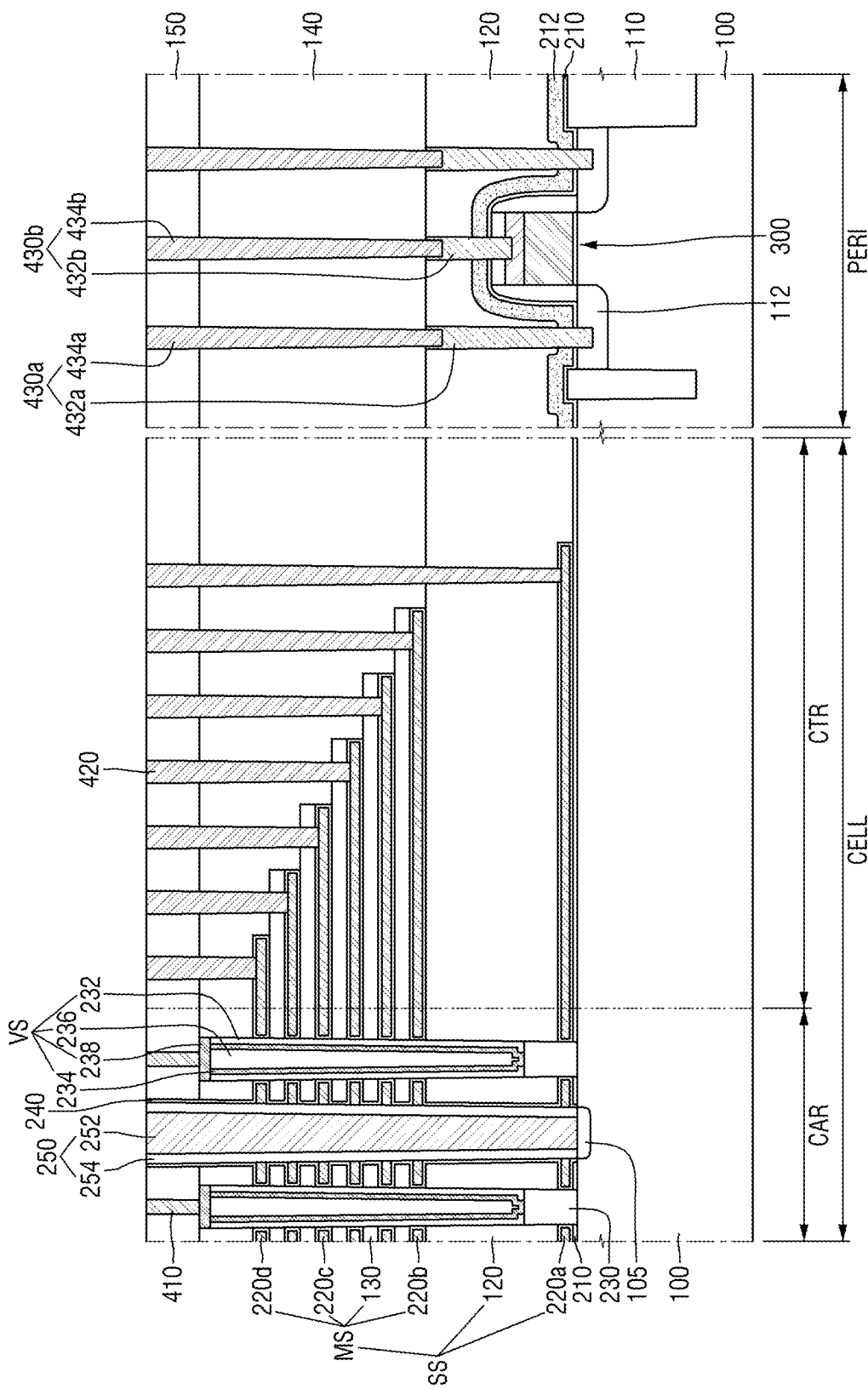

Referring to FIG. 29, channel contacts 410, cell contacts 420, and peripheral circuit contacts 430a and 430b are formed to fill the second contact holes CH2, the third contact holes CH3, and the fourth contact holes CH4a and CH4b, respectively.

In some example embodiments, the channel contacts 410, the cell contacts 420 and the peripheral circuit contacts 430a and 430b may be formed simultaneously.

Then, referring to FIG. 5, bit lines 415, first connection wirings 425, and second connection wirings 435 are formed on the channel contacts 410, the cell contacts 420, and the peripheral circuit contacts 430a and 430b, respectively.

Figure 30:
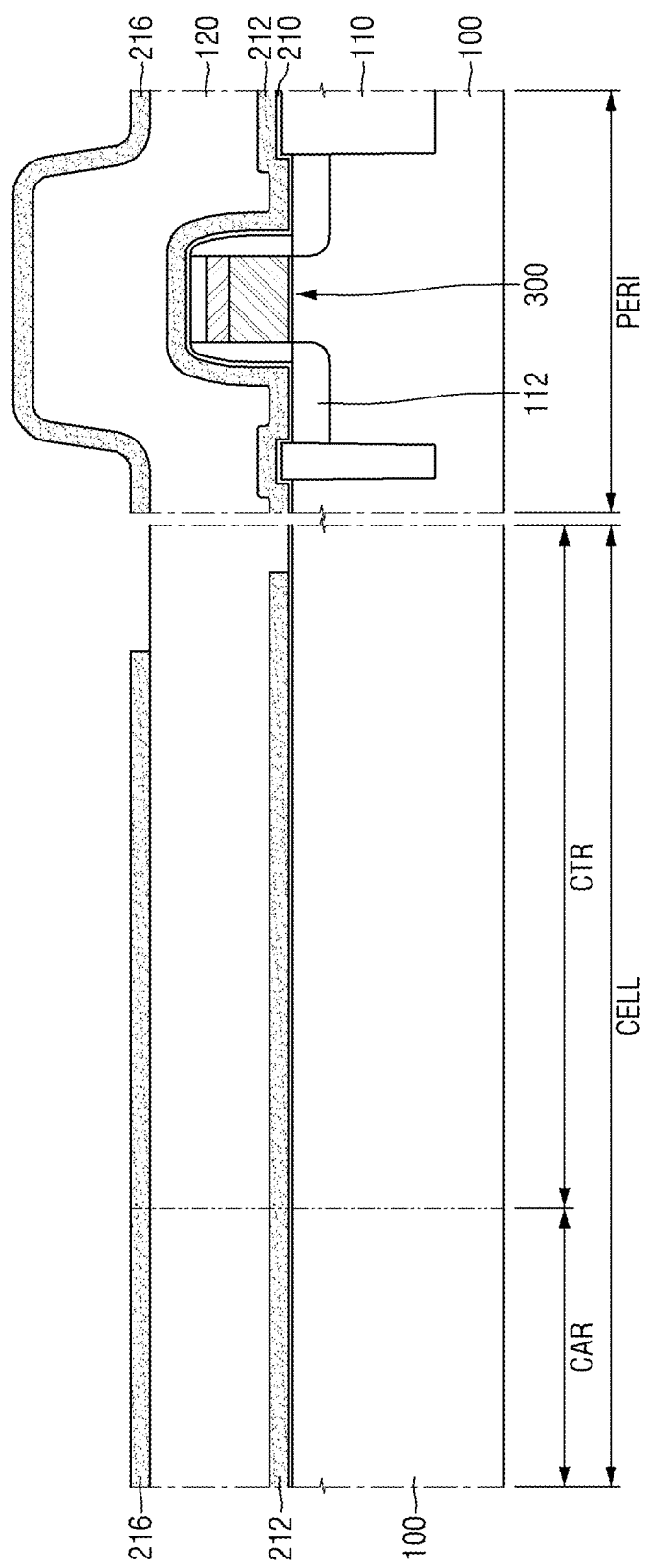
FIGS. 30 to 34 are diagrams illustrating the intermediate steps of a method for fabricating a nonvolatile memory device according to some example embodiments of the present inventive concepts.

FIGS. 30 to 34 are diagrams illustrating the intermediate steps of a method for fabricating a nonvolatile memory device according to some example embodiments of the present inventive concepts. For reference, FIG. 30 is a diagram explaining the step after FIG. 16.

Referring to FIG. 30, a first interlayer insulating film 120 and a second sacrificial pattern 216 are sequentially formed on a first sacrificial pattern 212. The formation of the first interlayer insulating film 120 is similar to the above description with reference to FIG. 17 and, thus, a detailed description thereof will be omitted.

For example, a second sacrificial layer (not shown) may be formed on the first interlayer insulating film 120 of the cell region CELL and the peripheral circuit region PERI. Then, the second sacrificial layer is patterned to form a second sacrificial pattern 216 extending along a portion of the substrate 100 of the cell region CELL, the substrate 100 of the peripheral circuit region PERI, and the peripheral circuit element 300.

Figure 31:
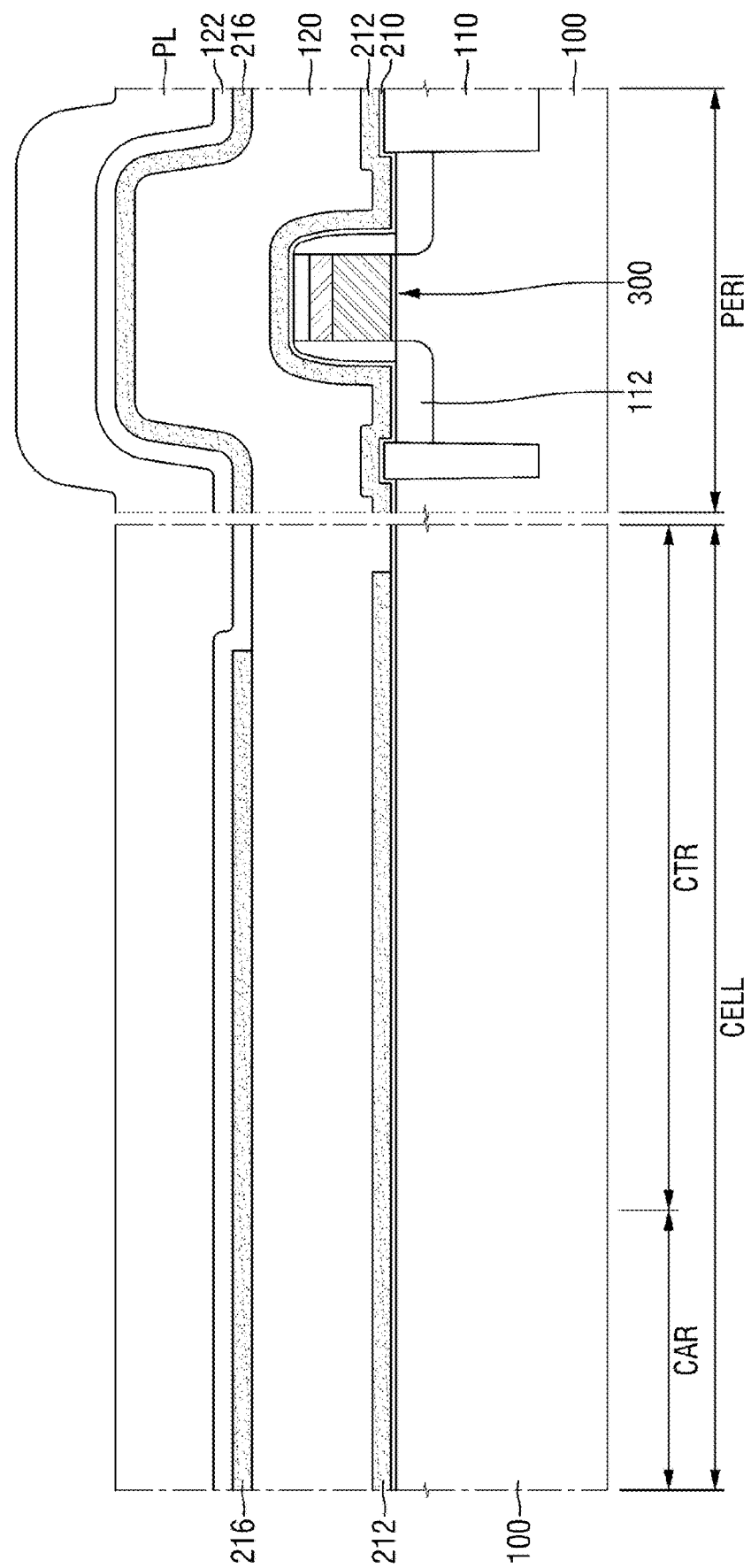

Referring to FIG. 31, a second insertion insulating layer 122 and a planarization film PL are sequentially formed on the second sacrificial pattern 216.

The second insertion insulating layer 122 may be formed conformally along the first interlayer insulating film 120 and the second sacrificial pattern 216. The second insertion insulating layer 122 may include, for example, at least one of silicon oxide, silicon nitride, and/or silicon oxynitride, but some other example embodiments of the present inventive concepts are not limited thereto.

For example, in a case where the first interlayer insulating film 120 includes silicon oxide, the planarization film PL may include silicon nitride.

Figure 32:
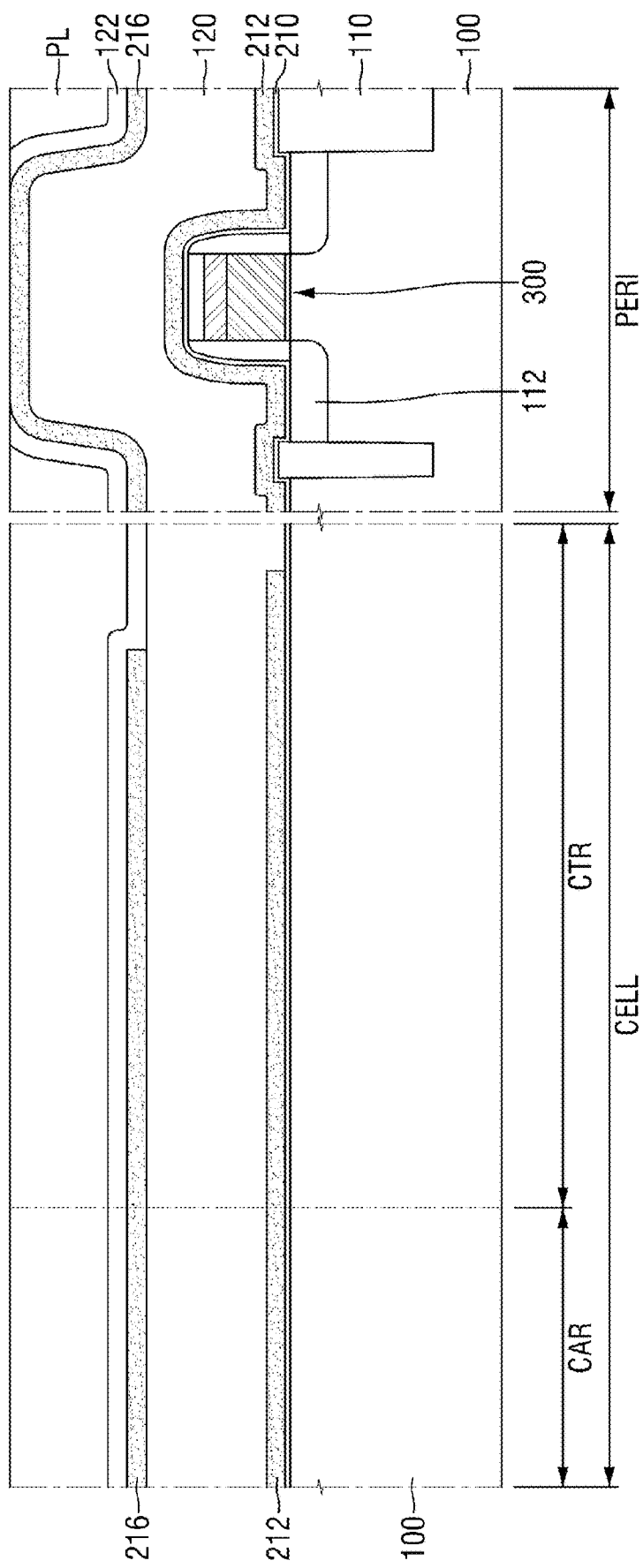

Referring to FIG. 32, the first planarization process is performed on the planarization film PL.

The first planarization process is performed to remove at least a portion of the planarization film PL and at least a portion of the second insertion insulation layer 122 in the peripheral circuit region PERI until the top surface of the second sacrificial pattern 216 is exposed, but some other example embodiments of the present inventive concepts are not limited thereto. For example, the first planarization process may also remove a portion of the second sacrificial pattern 216 in the peripheral circuit region PERI.

Figure 33:
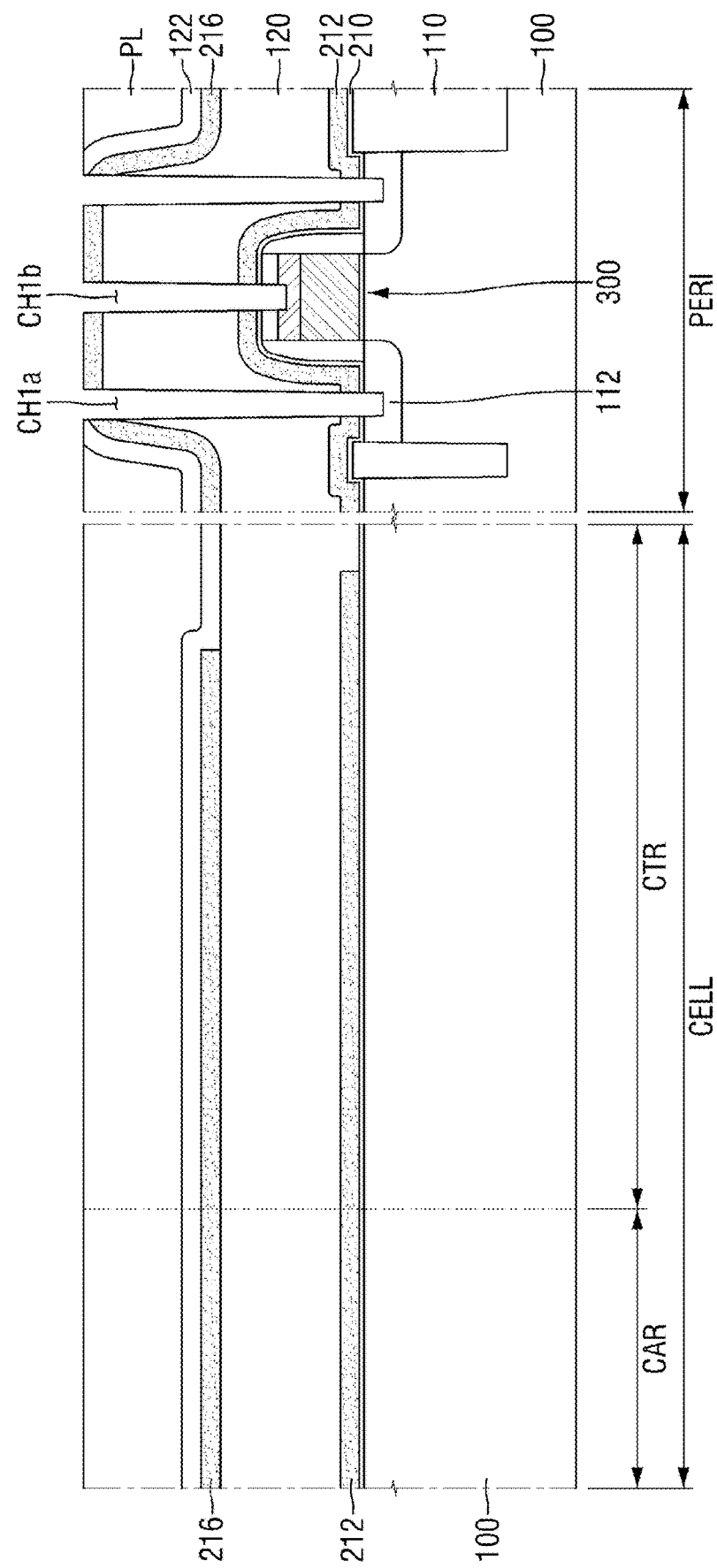

Referring to FIG. 33, first contact holes CH1a and CH1b are formed to pass through the second sacrificial pattern 216 and the first interlayer insulating film 120 and to expose at least a portion of the peripheral circuit element 300. The formation of the first contact holes CH1a and CH1b is similar to the above description with reference to FIG. 19 and, thus, a detailed description thereof will be omitted.

Figure 34:
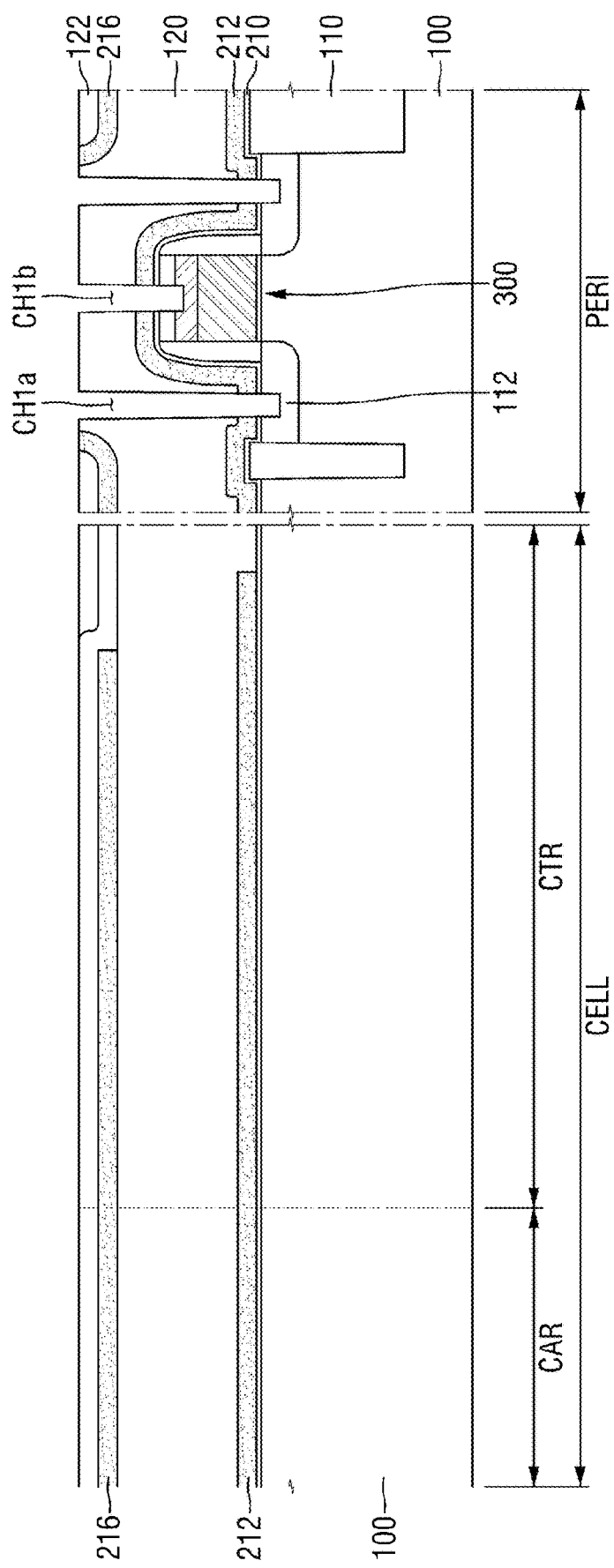

Referring to FIG. 34, the planarization film PL is removed.

For example, a second planarization process may be performed on the planarization film PL. The second planarization process may be performed until, for example, the planarization film PL is removed (e.g., any portion of the planarization film remaining after the first planarization process), but some other example embodiments of the present inventive concepts are not limited thereto. For example, the second planarization process may also remove a portion of the second insertion insulating layer 122, a portion of the second sacrificial pattern 216, and a portion of the first interlayer insulating film 120 in the peripheral circuit region PERI, but may leave a portion of the planarization film PL in the cell region CELL adjacent to the peripheral circuit region PERI. Thus, in some example embodiments, the top surface of the second insertion insulating layer 122 may be exposed as a result of the second planarization process. Further, in some example embodiments, a portion of the top surface of the first interlayer insulating film 120 and a portion of the second sacrificial pattern 216 may be exposed in the peripheral circuit region PERI as a result of the second planarization process.

Then, the steps of FIGS. 20 and 22 to 29 may be performed. In some other example embodiments, the step of FIG. 20 (forming lower contacts 432a and 432b filling the first contact holes CH1a and CH1b) may be performed before the step of FIG. 34 (second planarization process). Thus, the nonvolatile memory device of FIG. 10 may be fabricated.

While the present inventive concepts have been particularly shown and described with reference to some example embodiments thereof, it will be understood by those of ordinary skill in the art that various changes in form and details may be made therein without departing from the spirit and scope of the present inventive concepts as defined by the following claims. It is therefore desired that the present example embodiments be considered in all respects as illustrative and not restrictive, reference being made to the appended claims rather than the foregoing description to indicate the scope of the invention.

What is claimed is:

1. A nonvolatile memory device comprising:
a substrate including a cell region and a peripheral circuit region;
a stacked structure on the cell region, the stacked structure including a ground selection line, a plurality of word lines and a string selection line stacked sequentially from a top surface of the substrate, a lowermost word line of the plurality of word lines being a word line most adjacent to the ground selection line;
a peripheral circuit element on the peripheral circuit region;
a semiconductor pattern penetrating through the stacked structure;
a peripheral circuit contact including a lower contact and an upper contact, the lower contact being connected to the peripheral circuit element, and the upper contact being connected to the lower contact on the lower contact; and
a first cell contact connected to the ground selection line, wherein a height of a top surface of the lower contact being higher than a top surface of the ground selection line, and being lower than or equal to a height of a bottom surface of the lowermost word line of the plurality of word lines, the upper contact has a bottom surface below the top surface of the lower contact and the bottom surface of the upper contact is within the lower contact, and wherein a bottom surface of the first cell contact is below the top surface of the lower contact and in direct contact with the ground selection line.

2. The nonvolatile memory device of claim 1, further comprising a plurality of second cell contacts connected to the plurality of word lines.

3. The nonvolatile memory device of claim 2, wherein the upper contact, the first cell contact and the plurality of second cell contacts have substantially the same material composition.

4. The nonvolatile memory device of claim 1, further comprising a sacrificial pattern extending along a profile of a top surface of the peripheral circuit element, wherein the lower contact is connected to the peripheral circuit element through the sacrificial pattern.

5. The nonvolatile memory device of claim 4, wherein a thickness of the sacrificial pattern is substantially equal to a thickness of the ground selection line.

6. A nonvolatile memory device comprising:

a substrate including a cell region and a peripheral circuit region;

a stacked structure on the cell region, the stacked structure including a ground selection line, a plurality of word lines and a string selection line stacked sequentially from a top surface of the substrate, the plurality of word lines including a first word line being a lowermost word line of the plurality of word lines and being a word line most adjacent to the ground selection line;

a semiconductor pattern penetrating through the stacked structure;

a peripheral circuit element on the peripheral circuit region;

an interlayer insulating film covering the stacked structure and the peripheral circuit region on the substrate;

a lower contact connected to the peripheral circuit element in the interlayer insulating film;

an upper contact being connected to the lower contact on the lower contact; and a cell contact penetrating through the interlayer insulating film and connected to the ground selection line, wherein a height of a top surface of the lower contact being higher than a top surface of the ground selection line, and being lower than or equal to a height of a bottom surface of the first word line, the upper contact has a bottom surface below the top surface of the lower contact and the bottom surface of the upper contact is within the lower contact, and wherein a bottom surface of the cell contact is below the top surface of the lower contact and in direct contact with the ground selection line.

7. The nonvolatile memory device of claim 6, wherein the plurality of word lines further includes a second word line stacked on the first word line, a separation distance between the ground selection line and the first word line being greater than a separation distance between the first word line and the second word line.

8. The nonvolatile memory device of claim 7, wherein the ground selection line, the first word line and the second word line are an initial three gate patterns above the top surface of the substrate.

* * * * *